(12) United States Patent
Buehler et al.

(10) Patent No.: US 12,368,391 B2
(45) Date of Patent: Jul. 22, 2025

(54) SYSTEMS AND METHODS FOR POWER MODULE FOR INVERTER FOR ELECTRIC VEHICLE

(71) Applicant: BorgWarner US Technologies LLC, Wilmington, DE (US)

(72) Inventors: David Paul Buehler, Noblesville, IN (US); Kevin M. Gertiser, Carmel, IN (US); David W. Ihms, Kokomo, IN (US); Mark Wendell Gose, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 94 days.

(21) Appl. No.: 18/175,270

(22) Filed: Feb. 27, 2023

(65) Prior Publication Data

US 2024/0107675 A1 Mar. 28, 2024

Related U.S. Application Data

(60) Provisional application No. 63/377,486, filed on Sep. 28, 2022, provisional application No. 63/377,501,
(Continued)

(51) Int. Cl.
*H05K 1/02* (2006.01)
*B60L 3/00* (2019.01)
(Continued)

(52) U.S. Cl.
CPC ............. *H02P 27/06* (2013.01); *B60L 3/003* (2013.01); *B60L 15/007* (2013.01); *B60L 15/08* (2013.01);
(Continued)

(58) Field of Classification Search
CPC .......... H05K 1/02; H05K 1/145; H05K 1/181; H05K 1/182; H05K 5/0247;
(Continued)

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

DE 102013213448 A1 1/2015
DE 102017120507 A1 3/2018
(Continued)

OTHER PUBLICATIONS

Charlotte Gillot et al: "Double-Sided Cooling for High Power IGBT Modules Using Flip Chip Technology", IEEE Transactions on Components and Packaging Technologies,, vol. 24, No. 4, Dec. 1, 2001 (Dec. 1, 2001), XP011011286, ISSN: 1521-3331, abstract section entitled "A. Principle", and "B. Description of the Prototype"; p. 699, figure 3.
(Continued)

*Primary Examiner* — Xiaoliang Chen
(74) *Attorney, Agent, or Firm* — Joshua M. Haines; Bookoff McAndrews, PLLC

(57) ABSTRACT

A power module includes: a first substrate having an outer surface and an inner surface, the first substrate extending from a first longitudinal end toward a second longitudinal end; a semiconductor die coupled to the inner surface of the first substrate; and a second substrate having an outer surface and an inner surface, the semiconductor die being coupled to the inner surface of the second substrate, the second substrate extending from a first longitudinal end toward a second longitudinal end, wherein the first longitu-
(Continued)

dinal end of the first substrate is longitudinally offset from the first longitudinal end of the second substrate.

13 Claims, 18 Drawing Sheets

Related U.S. Application Data filed on Sep. 28, 2022, provisional application No. 63/377,512, filed on Sep. 28, 2022, provisional application No. 63/378,601, filed on Oct. 6, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 21/50* | (2006.01) | |
| *H01L 23/00* | (2006.01) | |
| *H01L 23/051* | (2006.01) | |
| *H01L 23/15* | (2006.01) | |
| *H01L 23/20* | (2006.01) | |
| *H01L 23/26* | (2006.01) | |
| *H01L 23/36* | (2006.01) | |
| *H01L 23/367* | (2006.01) | |
| *H01L 23/373* | (2006.01) | |
| *H01L 23/40* | (2006.01) | |
| *H01L 23/42* | (2006.01) | |
| *H01L 23/467* | (2006.01) | |
| *H01L 23/473* | (2006.01) | |
| *H01L 23/492* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H01L 25/18* | (2023.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *H10D 64/01* | (2025.01) | |
| *B60L 15/20* | (2006.01) | |
| *H03K 19/20* | (2006.01) | |

(52) U.S. Cl.
CPC ............ *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC ............ H05K 7/20145; H05K 7/2039; H05K 7/2049; H05K 7/20854; H01L 21/50; H01L 21/561; H01L 21/568; H01L 21/4825; H01L 21/4871; H01L 21/4882; H01L 23/051; H01L 23/15; H01L 23/20; H01L 23/26; H01L 23/36; H01L 23/42; H01L 23/293; H01L 23/367; H01L 23/373; H01L 23/467; H01L 23/473; H01L 23/492; H01L 23/3107; H01L 23/3114; H01L 23/3121; H01L 23/3672; H01L 23/3675; H01L 23/3735; H01L 23/4006; H01L 23/4334; H01L 23/4924;
H01L 23/4952; H01L 23/5398; H01L
23/49531; H01L 23/49562; H01L
23/49575; H01L 23/49586; H01L
23/49811; H01L 24/05; H01L 24/06;
H01L 24/10; H01L 24/11; H01L 24/19;
H01L 24/20; H01L 24/29; H01L 24/32;
H01L 24/33; H01L 24/72; H01L 24/73;
H01L 24/82; H01L 24/96; H01L 24/97;
H01L 25/0655; H01L 25/072; H01L
25/18; H01L 25/50; B60L 50/06; B60L
50/64; B60L 50/40; B60L 50/51; B60L
53/20; B60L 53/22; B60L 53/62; B60L
3/003; B60L 15/007; B60L 15/08; B60R
16/02; H02P 29/68; H02P 27/06; H02P
27/08; H02M 1/0009; H02M 1/0054;
H02M 1/084; H02M 1/088; H02M 1/32;
H02M 1/44; H02M 1/123; H02M 1/322;
H02M 1/327; H02M 1/4258; H02M
7/003; H02M 7/537; H02M 7/5387;
H02M 7/53871; H02M 7/53875; G01R
15/20; G06F 1/08
USPC .......... 361/783, 699, 719, 761; 257/79, 100,
257/103, 666, 675, 734, 779; 438/22,
438/107, 109, 111, 118, 121, 122, 123,
438/127
See application file for complete search history.

(56) References Cited

U.S. PATENT DOCUMENTS

| | | | |
|---|---|---|---|
| 4,564,771 A | 1/1986 | Flohrs | |
| 4,618,875 A | 10/1986 | Flohrs | |
| 4,716,304 A | 12/1987 | Fiebig et al. | |
| 4,717,948 A * | 1/1988 | Sakai | H01L 23/20 |
| | | | 257/E23.128 |
| 5,068,703 A | 11/1991 | Conzelmann et al. | |
| 5,432,371 A | 7/1995 | Denner et al. | |
| 5,559,661 A | 9/1996 | Meinders | |
| 5,654,863 A | 8/1997 | Davies | |
| 5,764,007 A | 6/1998 | Jones | |
| 5,841,312 A | 11/1998 | Mindl et al. | |
| 6,028,470 A | 2/2000 | Michel et al. | |
| 6,163,138 A | 12/2000 | Kohl et al. | |
| 6,351,173 B1 | 2/2002 | Ovens et al. | |
| 6,426,857 B1 | 7/2002 | Doster et al. | |
| 6,597,556 B1 | 7/2003 | Michel et al. | |
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,229,855 B2 | 6/2007 | Murphy | |
| 7,295,433 B2 | 11/2007 | Taylor et al. | |
| 7,459,954 B2 | 12/2008 | Kuehner et al. | |
| 7,538,425 B2 | 5/2009 | Myers et al. | |
| 7,551,439 B2 * | 6/2009 | Peugh | H01L 23/473 |
| | | | 174/15.1 |
| 7,616,047 B2 | 11/2009 | Rees et al. | |
| 7,724,046 B2 | 5/2010 | Wendt et al. | |
| 7,750,720 B2 | 7/2010 | Dittrich | |
| 8,120,153 B1 * | 2/2012 | Shen | H01L 23/49537 |
| | | | 257/789 |
| 9,088,159 B2 | 7/2015 | Peuser | |
| 9,275,915 B2 | 3/2016 | Heinisch et al. | |
| 9,373,970 B2 | 6/2016 | Feuerstack et al. | |
| 9,407,251 B1 | 8/2016 | Passmore et al. | |
| 9,431,932 B2 | 8/2016 | Schmidt et al. | |
| 9,515,584 B2 | 12/2016 | Koller et al. | |
| 9,548,675 B2 | 1/2017 | Schoenknecht | |
| 9,806,607 B2 | 10/2017 | Ranmuthu et al. | |
| 9,843,320 B2 | 12/2017 | Richter et al. | |
| 9,871,444 B2 | 1/2018 | Ni et al. | |
| 9,882,490 B2 | 1/2018 | Veeramreddi et al. | |
| 10,002,821 B1 * | 6/2018 | Hoegerl | H01L 23/051 |
| 10,111,285 B2 | 10/2018 | Shi et al. | |
| 10,116,300 B2 | 10/2018 | Blasco et al. | |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | S et al. | |
| 2002/0019073 A1 * | 2/2002 | Moon | H01L 24/81 |
| | | | 438/109 |
| 2005/0077614 A1 * | 4/2005 | Chengalva | H01L 23/42 |
| | | | 257/E23.087 |
| 2005/0078456 A1 * | 4/2005 | Mandel | H01L 23/427 |
| | | | 257/E23.105 |
| 2006/0124939 A1 * | 6/2006 | Lee | H01L 33/0093 |
| | | | 438/22 |
| 2006/0284208 A1 * | 12/2006 | Kang | H01L 24/82 |
| | | | 257/100 |
| 2006/0289892 A1 * | 12/2006 | Lee | H01L 33/0093 |
| | | | 257/103 |

(56) References Cited

U.S. PATENT DOCUMENTS

| | | | |
|---|---|---|---|
| 2008/0054439 A1* | 3/2008 | Malhan | H01L 23/5385 |
| | | | 257/E23.071 |
| 2008/0224285 A1* | 9/2008 | Lim | H01L 23/49575 |
| | | | 257/E23.092 |
| 2011/0140283 A1* | 6/2011 | Chandra | H01L 25/105 |
| | | | 257/E23.141 |
| 2012/0175755 A1* | 7/2012 | Bayerer | H01L 23/36 |
| | | | 438/122 |
| 2012/0292778 A1* | 11/2012 | Liu | H01L 25/16 |
| | | | 257/774 |
| 2012/0326337 A1* | 12/2012 | Camacho | H01L 24/19 |
| | | | 257/782 |
| 2013/0200532 A1* | 8/2013 | Otremba | H01L 24/32 |
| | | | 438/123 |
| 2013/0292813 A1* | 11/2013 | Yang | H01L 24/25 |
| | | | 257/676 |
| 2014/0035112 A1* | 2/2014 | Kadoguchi | H01L 23/49575 |
| | | | 438/123 |
| 2014/0159216 A1* | 6/2014 | Ishino | H01L 23/3114 |
| | | | 438/122 |
| 2014/0353818 A1* | 12/2014 | Geitner | H01L 23/3735 |
| | | | 257/734 |
| 2015/0216054 A1* | 7/2015 | Standing | H01L 25/072 |
| | | | 228/180.21 |
| 2015/0227829 A1* | 8/2015 | Finn | B42D 15/00 |
| | | | 438/118 |
| 2015/0332986 A1* | 11/2015 | Tomohiro | H01L 25/0652 |
| | | | 257/737 |
| 2016/0126157 A1 | 5/2016 | Jeon | |
| 2016/0126197 A1* | 5/2016 | Matoy | H01L 23/49562 |
| | | | 257/773 |
| 2016/0322527 A1* | 11/2016 | Hwang | H01L 31/0488 |
| 2017/0331469 A1 | 11/2017 | Kilb et al. | |
| 2017/0365583 A1 | 12/2017 | Im et al. | |
| 2018/0150673 A1* | 5/2018 | Ng | G06V 40/1318 |
| 2018/0167013 A1 | 6/2018 | Xu et al. | |
| 2019/0103340 A1* | 4/2019 | Tsuchimochi | H01L 23/4334 |
| 2020/0195121 A1 | 6/2020 | Keskar et al. | |
| 2020/0266132 A1* | 8/2020 | Cho | H01L 23/49551 |
| 2020/0321301 A1* | 10/2020 | Mitarai | H01L 23/3107 |
| 2020/0335411 A1* | 10/2020 | Rokubuichi | H01L 24/82 |
| 2020/0365548 A1* | 11/2020 | Fuergut | H01L 24/97 |
| 2021/0005711 A1 | 1/2021 | Martinez-Limia et al. | |
| 2021/0013136 A1* | 1/2021 | Cho | H01L 23/49861 |
| 2021/0020456 A1* | 1/2021 | Oohiraki | H01L 24/73 |
| 2021/0134762 A1* | 5/2021 | Hayashi | H01L 23/053 |
| 2022/0052610 A1 | 2/2022 | Plum | |
| 2022/0238413 A1* | 7/2022 | Grassmann | H01L 23/3735 |
| 2022/0294441 A1 | 9/2022 | Purcarea et al. | |
| 2022/0406744 A1* | 12/2022 | Eom | H01L 23/5389 |
| 2023/0010616 A1 | 1/2023 | Gschwantner et al. | |
| 2023/0061922 A1 | 3/2023 | Ritter | |
| 2023/0082076 A1 | 3/2023 | Strache et al. | |
| 2023/0126070 A1 | 4/2023 | Oberdieck et al. | |
| 2023/0179198 A1 | 6/2023 | Winkler | |
| 2023/0231210 A1 | 7/2023 | Joos et al. | |
| 2023/0231400 A1 | 7/2023 | Oberdieck et al. | |
| 2023/0231496 A1 | 7/2023 | Syed et al. | |
| 2023/0238808 A1 | 7/2023 | Swoboda et al. | |
| 2023/0268826 A1 | 8/2023 | Yan et al. | |
| 2023/0335509 A1 | 10/2023 | Poddar | |
| 2023/0352377 A1* | 11/2023 | Truessel | H01L 23/49579 |
| 2023/0365086 A1 | 11/2023 | Schumacher et al. | |
| 2023/0370062 A1 | 11/2023 | Wolf | |
| 2023/0378022 A1 | 11/2023 | Kim et al. | |
| 2023/0386963 A1 | 11/2023 | Kim et al. | |
| 2023/0402930 A1 | 12/2023 | Corry et al. | |
| 2023/0420968 A1 | 12/2023 | Oner et al. | |
| 2023/0421049 A1 | 12/2023 | Neidorff | |
| 2024/0006869 A1 | 1/2024 | Kim et al. | |
| 2024/0006899 A1 | 1/2024 | Wernerus | |
| 2024/0006993 A1 | 1/2024 | Barjati et al. | |
| 2024/0022187 A1 | 1/2024 | Fassnacht | |
| 2024/0022240 A1 | 1/2024 | Balaz | |
| 2024/0022244 A1 | 1/2024 | S et al. | |
| 2024/0030730 A1 | 1/2024 | Wernerus | |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0100963 A1 | 3/2024 | Buehler et al. | |
| 2024/0105276 A1 | 3/2024 | Duryea | |
| 2024/0105533 A1 | 3/2024 | Buehler et al. | |
| 2024/0105534 A1 | 3/2024 | Buehler et al. | |
| 2024/0106248 A1 | 3/2024 | Woll et al. | |
| 2024/0106338 A1* | 3/2024 | Buehler | H02P 29/027 |
| 2024/0106435 A1 | 3/2024 | Zhang et al. | |
| 2024/0107675 A1* | 3/2024 | Buehler | B60L 15/007 |
| 2024/0113517 A1 | 4/2024 | Sriraj et al. | |
| 2024/0113611 A1 | 4/2024 | Kaufmann et al. | |
| 2024/0113620 A1 | 4/2024 | Ranmuthu et al. | |
| 2024/0113624 A1 | 4/2024 | Southard et al. | |
| 2024/0120558 A1 | 4/2024 | Zhang et al. | |
| 2024/0120765 A1 | 4/2024 | Oner et al. | |
| 2024/0120962 A1 | 4/2024 | Miriyala et al. | |
| 2024/0128851 A1 | 4/2024 | Ruck et al. | |
| 2024/0128859 A1 | 4/2024 | Chen | |
| 2024/0128867 A1 | 4/2024 | Wang et al. | |
| 2024/0146177 A1 | 5/2024 | Mehdi et al. | |
| 2024/0146306 A1 | 5/2024 | Ramkaj et al. | |
| 2024/0149734 A1 | 5/2024 | Eisenlauer | |
| 2024/0162723 A1 | 5/2024 | Zipf et al. | |
| 2024/0178756 A1 | 5/2024 | El-Markhi et al. | |
| 2024/0178824 A1 | 5/2024 | Kazama et al. | |
| 2024/0186803 A1 | 6/2024 | Krieg et al. | |
| 2024/0198937 A1 | 6/2024 | Benqassmi et al. | |
| 2024/0198938 A1 | 6/2024 | Carlos et al. | |
| 2024/0204540 A1 | 6/2024 | Majmunovic et al. | |
| 2024/0204541 A1 | 6/2024 | Majmunovic et al. | |
| 2024/0204671 A1 | 6/2024 | Liu et al. | |
| 2024/0204765 A1 | 6/2024 | Dake | |
| 2024/0213874 A1 | 6/2024 | Junnarkar et al. | |
| 2024/0213971 A1 | 6/2024 | Lee | |
| 2024/0213975 A1 | 6/2024 | Narayanasamy | |
| 2024/0213981 A1 | 6/2024 | Agarwal et al. | |

FOREIGN PATENT DOCUMENTS

| | | |
|---|---|---|
| EP | 3690938 A1 | 8/2020 |
| WO | 2007093598 A1 | 8/2007 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021167596 A1 | 8/2021 |
| WO | 2021213728 A1 | 10/2021 |
| WO | 2022012943 A1 | 1/2022 |
| WO | 2022078725 A1 | 4/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |

(56) References Cited

FOREIGN PATENT DOCUMENTS

| | | |
|---|---|---|
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Huang Zhizhao et al: "A High-Performance Embedded SiC Power Module Based on a DBC-Stacked Hybrid Packaging Structure", IEEE Journal of Emerging and Selected Topics in Power Electronics, IEEE, Piscataway, NJ, USA, vol. 8, No. 1, Sep. 25, 2019, pp. 351-366, XP011769559.

Wang et al. "Status and Trend of Power Semiconductor Module Packaging for Electric Vehicles", InTech, published Oct. 5, 2016.

"DuPont Pyralux® AP to Aid Reliable Performance of Semikron-Danfoss eMPack® Modules Powering Next-Gen Electric Vehicles", dupont.com Ideas and Innovation Blog, <<https://www.dupont.com/blogs/dupont-pyralux-to-aid-reliable-next-gen-electric-vehicles.html>>, Sep. 22, 2022.

"E-Mobility and Utility Electric Vehicles" Semikron Danfoss brochure <<https://www.semikron-danfoss.com/dl/service-support/downloads/download/semikron-danfoss-brochure-power-electronics-for-emobility-utility-electric-vehicles.pdf>>, issued Mar. 31, 2022.

"Technical Explanation eMPack A4 Application Kit", Semikron, <<https://www.semikron-danfoss.com/dl/service-support/downloads/download/semikron-technical-explanation-empack-applicationkit-2021-02-05-rev-04.pdf>>, issued Feb. 5, 2021.

"SiC power modules for your electric vehicle design", STMicroelectronics <<https://www.st.com/content/dam/pcim-2020/presentations/stmicroelectronics-pcim2020-sic-power-modules-for-your-electric-vehicle-designs.pdf>>, retrieved Jan. 28, 2022.

"DuPont Pyralux LF Acrylic-Based Coverlay", pyralux.dupont.com, <<https://www.dupont.com/content/dam/dupont/amer/us/en/products/ei-transformation/documents/EI-10118-Pyralux-LF-CL-Data-Sheet.pdf>>, retrieved Oct. 26, 2021.

"DuPont Pyralux AP All-Polyimide Double-Sided Copper-Clad Laminate", pyralux.dupont.com, <<https://www.dupont.com/content/dam/dupont/amer/us/en/products/ei-transformation/documents/EI-10124-Pyralux-AP-Data-Sheet.pdf>>, retrieved Sep. 23, 2021.

"Flex and Material Sets with Chris Hunrath", podcast with Judy Warner, altium.com, <<https://resources.altium.com/p/flex-and-material-sets-with-chris-hunrath-podcast>>, retrieved Oct. 18, 2021.

"Kapton Polyimide Film and Pyralux Laminated Circuit Materials Provide Superior Performance in Satellite/Spacecraft Applications", dupont.com, <<https://www.dupont.com/content/dam/dupont/amer/us/en/products/ei-transformation/documents/EI00373_Space-Application-Flyer.pdf>>, Aug. 2021.

DeVoto, Douglas, "Advanced Power Electronics Designs—Reliability and Prognostics" National Renewable Energy Laboratory, nrel.gov, <<https://www.nrel.gov/docs/fy20osti/76667.pdf>>, Jun. 2, 2020.

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR POWER MODULE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to a power module for an inverter for an electric vehicle, and more specifically, to a power module including an electrically conductive spacer or flexible circuit.

BACKGROUND

Inverters, such as those used to drive a motor in an electric vehicle, for example, are responsible for converting High Voltage Direct Current (HVDC) into Alternating Current (AC) to drive the motor. In an inverter, a power module may include devices that generate a large amount of heat. The layout and design of the power module affects the operation of the devices and the thermal characteristics of the power module. Incorrect operation of the devices or overheating of the power module may compromise the operation of the inverter.

The present disclosure is directed to overcoming one or more of these above-referenced challenges.

SUMMARY OF THE DISCLOSURE

In some aspects, the techniques described herein relate to a power module, including: a first substrate having an outer surface and an inner surface; a semiconductor die coupled to the inner surface of the first substrate; a second substrate having an outer surface and an inner surface, the semiconductor die being coupled to the inner surface of the second substrate; and a first electrically conductive spacer coupled to inner surface of the first substrate and to the inner surface of the second substrate.

In some aspects, the techniques described herein relate to a power module, wherein the first substrate further includes a middle section between the inner surface and the outer surface, wherein the middle section includes a ceramic, and the outer surface and the inner surface of the first substrate includes a metal.

In some aspects, the techniques described herein relate to a power module, further including a first lead coupled to the inner surface of the second substrate.

In some aspects, the techniques described herein relate to a power module, wherein the first electrically conductive spacer is coupled to a first part of the inner surface of the second substrate, and the semiconductor die is coupled to a second part of the inner surface of the second substrate, wherein the first part and the second part are not directly coupled to one another.

In some aspects, the techniques described herein relate to a power module, further including a second electrically conductive spacer coupled to the inner surface of the second substrate and to the inner surface of the first substrate.

In some aspects, the techniques described herein relate to a power module, wherein the first electrically conductive spacer and the second electrically conductive spacer are coplanar.

In some aspects, the techniques described herein relate to a power module, wherein the ceramic includes silicon nitride.

In some aspects, the techniques described herein relate to a power module, wherein the second substrate further includes a middle layer between the inner surface and the outer surface, wherein the middle layer includes a ceramic, and the outer surface and the inner surface of the second substrate includes a metal.

In some aspects, the techniques described herein relate to a power module, wherein the source connection of the semiconductor die is coplanar with the connection.

In some aspects, the techniques described herein relate to a power module, wherein the semiconductor die includes a drain, wherein the drain is coupled to the inner surface of the first substrate.

In some aspects, the techniques described herein relate to a power module, wherein the semiconductor die includes a source, wherein the source is coupled to the inner surface of the second substrate.

In some aspects, the techniques described herein relate to an inverter including the power module.

In some aspects, the techniques described herein relate to a vehicle including the inverter.

In some aspects, the techniques described herein relate to a system including: an inverter configured to convert DC power from a battery to AC power to drive a motor, wherein the inverter includes: a power module for an inverter for an electric vehicle, the power module including: a first substrate; a second substrate; and an electrically conductive spacer connecting the first substrate to the second substrate.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a lower substrate including an upper conductive layer; an upper substrate including a lower conductive layer; and one or more electrically conductive spacers between the lower substrate and the upper substrate, the one or more electrically conductive spacers configured to maintain a distance between the lower substrate and the upper substrate and provide an electrically conductive path from the lower conductive layer to the upper conductive layer.

In some aspects, the techniques described herein relate to a system, wherein: the lower conductive layer includes a first lower conductive region, a second lower conductive region, and a third lower conductive region, and the upper conductive layer includes a first upper conductive region and a second upper conductive region.

In some aspects, the techniques described herein relate to a system, wherein: the one or more electrically conductive spacers includes a first electrically conductive spacer and a second electrically conductive spacer, the first electrically conductive spacer connects the first lower conductive region to the first upper conductive region, and the second electrically conductive spacer connects the second lower conductive region to the second upper conductive region.

In some aspects, the techniques described herein relate to a system, wherein the power module further includes: a first power switch configured to selectively electrically connect the first upper conductive region to the second lower conductive region, and a second power switch configured to selectively electrically connect the third lower conductive region to the second upper conductive region.

In some aspects, the techniques described herein relate to a system, wherein the power module further includes: a first interconnect on the first lower conductive region, a second interconnect on the third lower conductive region, and a third interconnect on the third lower conductive region.

In some aspects, the techniques described herein relate to a system, wherein: the first power switch is configured to selectively electrically connect the first interconnect to the third interconnect through the first lower conductive region, the first electrically conductive spacer, the first upper conductive region, the first power switch, and the second lower conductive region, and the second power switch is configured to selectively electrically connect the second interconnect to the third interconnect through the third lower conductive region, the second power switch, the second upper conductive region, the second electrically conductive spacer, and the second lower conductive region.

In some aspects, the techniques described herein relate to a power module, including: a first substrate; a second substrate; a semiconductor die disposed between the first substrate and the second substrate, the semiconductor die having a drain coupled to the first substrate, and a source coupled to the second substrate; a first electrically conductive spacer disposed between the first substrate and the second substrate, wherein a connection between the first electrically conductive spacer and the first substrate is coplanar with a connection between the drain of the semiconductor die and the first substrate.

In some aspects, the techniques described herein relate to a power module, wherein a connection between the first electrically conductive spacer and the second substrate is coplanar with a connection between the source of the semiconductor die and the second substrate.

In some aspects, the techniques described herein relate to a power module, including: a first substrate having an outer surface and an inner surface; a semiconductor die coupled to the inner surface of the first substrate; a second substrate having an outer surface and an inner surface, the semiconductor die being coupled to the inner surface of the second substrate; and a flex circuit coupled to the semiconductor die.

In some aspects, the techniques described herein relate to a power module, wherein the flex circuit is coupled to the inner surface of the second substrate.

In some aspects, the techniques described herein relate to a power module, wherein the flex circuit includes an insulating material and an electrically conductive material, wherein the inner surface of the second substrate is electrically insulated from the electrically conductive material of the flex circuit.

In some aspects, the techniques described herein relate to a power module, wherein the electrically conductive material of the flex circuit is coupled to the semiconductor die.

In some aspects, the techniques described herein relate to a power module, wherein the semiconductor die includes a gate, wherein the electrically conductive material of the flex circuit is coupled to the gate of the semiconductor die.

In some aspects, the techniques described herein relate to a power module, wherein the semiconductor die is coupled to the second substrate, through the flex circuit.

In some aspects, the techniques described herein relate to a power module, wherein the semiconductor die includes a source connection, wherein the source connection is coupled to the second substrate, through the flex circuit.

In some aspects, the techniques described herein relate to a power module, wherein the semiconductor die includes a gate, wherein electrical connections to the gate are contained only within the flex circuit.

In some aspects, the techniques described herein relate to a power module, wherein the semiconductor die includes a gate, wherein electrical connections to the gate, within the power module, are contained solely within the flex circuit.

In some aspects, the techniques described herein relate to a power module, wherein the semiconductor die includes a gate, wherein electrical connections to the gate, within the power module, do not extend through any part of the second substrate.

In some aspects, the techniques described herein relate to a power module, wherein the first substrate further includes a middle section between the inner surface and the outer surface, wherein the middle section includes a ceramic and the outer surface and the inner surface of the first substrate include a metal.

In some aspects, the techniques described herein relate to a power module, wherein the ceramic include silicon nitride.

In some aspects, the techniques described herein relate to a power module, further include a first lead coupled to the inner surface of the second substrate.

In some aspects, the techniques described herein relate to a power module, wherein the second substrate further includes a middle surface between the inner surface and the outer surface, wherein the inner surface includes a ceramic and the outer surface and the inner surface of the second substrate include a metal.

In some aspects, the techniques described herein relate to a power module, wherein the semiconductor die includes a drain, wherein the drain is coupled to the inner surface of the first substrate.

In some aspects, the techniques described herein relate to a power module, wherein the semiconductor die includes a source, wherein the source is coupled to the inner surface of the second substrate.

In some aspects, the techniques described herein relate to an inverter, including the power module.

In some aspects, the techniques described herein relate to a vehicle, including the inverter.

In some aspects, the techniques described herein relate to a power module, including: a semiconductor die having a source connection, a drain connection, and a gate; a substrate coupled to the source connection; and a flex circuit coupled to gate, wherein electrical connections to the gate, within the power module, are contained solely within the flex circuit.

In some aspects, the techniques described herein relate to a power module, including: a semiconductor die having a source connection, a drain connection, and a gate; a substrate coupled to the source connection; and a flex circuit coupled to gate, wherein electrical connections to the gate, within the power module, do not extend through any part of the substrate.

In some aspects, the techniques described herein relate to a system including: an inverter configured to convert DC power from a battery to AC power to drive a motor, wherein the inverter includes: a power module including: a first substrate including a first conductive layer; a second substrate including a second conductive layer; a power switch between the first substrate and the second substrate; and a flex layer between the first substrate and the second substrate, the flex layer electrically connected to the power switch.

In some aspects, the techniques described herein relate to a system, wherein the first conductive layer and the second conductive layer are configured to route high voltage power through the power switch, and the flex layer is configured to route a control signal to the power switch.

In some aspects, the techniques described herein relate to a system, wherein the flex layer includes a base polyimide material, an internal conductive layer, and a coverlet.

In some aspects, the techniques described herein relate to a system, wherein the base polyimide material of the flex layer is laminated to the first conductive layer.

In some aspects, the techniques described herein relate to a system, wherein: the power switch includes a power switch gate connection, and the base polyimide material and the internal conductive layer are routed between the first conductive layer and the power switch gate connection so that the internal conductive layer is electrically connected to the power switch gate connection and the internal conductive layer is electrically insulated from the first conductive layer by the base polyimide material.

In some aspects, the techniques described herein relate to a system, wherein the flex layer is configured to insulate a perimeter of the power switch from the first conductive layer.

In some aspects, the techniques described herein relate to a system, wherein the flex layer is configured to prevent disruption of current flowing in the first conductive layer.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a first substrate including a first conductive layer; a second substrate including a second conductive layer; a power switch between the first substrate and the second substrate; and a flex layer between the first substrate and the second substrate, the flex layer electrically connected to the power switch.

In some aspects, the techniques described herein relate to a system, wherein: the power switch includes a power switch gate connection, and the power module further includes: a point-of-use controller between the first substrate and the second substrate, the point-of-use controller configured to provide a signal via the flex layer to the power switch gate connection to control the power switch.

In some aspects, the techniques described herein relate to a system, wherein: the power switch further includes a control connection, and the point-of-use controller is electrically connected to the control connection via the flex layer.

In some aspects, the techniques described herein relate to a system, wherein: the power switch further includes: a first power connection connected to one or more of the first conductive layer or the second conductive layer, and a second power connection connected to one or more of the first conductive layer or the second conductive layer.

In some aspects, the techniques described herein relate to a system, wherein: the first power connection is configured to be connected to a power supply, and the second power connection is configured to be connected to a load.

In some aspects, the techniques described herein relate to a system, wherein: the power switch is configured to control a flow of current between the first conductive layer and the second conductive layer to control a flow of current between the power supply and the load, and the flex layer is configured to route a control signal to the power switch.

In some aspects, the techniques described herein relate to a system including: a power module for an inverter, the power module including: a lower substrate including a lower conductive layer; an upper substrate including an upper conductive layer; a power switch between the lower conductive layer and the upper conductive layer, the power switch including a power switch gate connection; and a flex layer between the lower conductive layer and the upper conductive layer, the flex layer electrically connected to the power switch gate connection.

In some aspects, the techniques described herein relate to a system, wherein the power module further includes: a gate control pin, wherein the flex layer electrically connects the gate control pin to the power switch gate connection.

In some aspects, the techniques described herein relate to a system, wherein the power module further includes: a gate control pin, and a point-of-use controller, wherein the flex layer electrically connects the gate control pin to the point-of-use controller, and electrically connects the point-of-use controller to the power switch gate connection.

In some aspects, the techniques described herein relate to a system, wherein the flex layer includes an insulating layer and a conductive layer.

In some aspects, the techniques described herein relate to a system, wherein the insulating layer is connected to the lower conductive layer.

In some aspects, the techniques described herein relate to a system, wherein the power switch includes a die, and wherein the die includes: an upper surface connected to the upper conductive layer, and a lower surface connected to the lower conductive layer through an opening in the flex layer.

In some aspects, the techniques described herein relate to a power module, including: a first substrate having an outer surface and an inner surface, the first substrate extending from a first longitudinal end toward a second longitudinal end; a semiconductor die coupled to the inner surface of the first substrate; and a second substrate having an outer surface and an inner surface, the semiconductor die being coupled to the inner surface of the second substrate, the second substrate extending from a first longitudinal end toward a second longitudinal end, wherein the first longitudinal end of the first substrate is longitudinally offset from the first longitudinal end of the second substrate.

In some aspects, the techniques described herein relate to a power module, wherein the second longitudinal end of the first substrate is offset from the second longitudinal end of the second substrate.

In some aspects, the techniques described herein relate to a power module, wherein a length of the first substrate is approximately equal to a length of the second substrate.

In some aspects, the techniques described herein relate to a power module, wherein a length of the first substrate is greater than a length of the second substrate.

In some aspects, the techniques described herein relate to a power module, further including a first lead frame coupled to the inner surface of the first substrate.

In some aspects, the techniques described herein relate to a power module, further including a second lead frame coupled to the inner surface of the first substrate.

In some aspects, the techniques described herein relate to a power module, further including a second lead frame coupled to the inner surface of the second substrate.

In some aspects, the techniques described herein relate to a power module, wherein the first lead frame has a thickness greater than 500 microns.

In some aspects, the techniques described herein relate to a power module, wherein the first lead frame has a thickness greater than 700 microns.

In some aspects, the techniques described herein relate to a power module, wherein the first lead frame has a thickness greater than a space between the inner surface of the first substrate and the inner surface of the second substrate.

In some aspects, the techniques described herein relate to a power module, further including an overmold coupled to the first substrate, the second substrate, and the semiconductor die.

In some aspects, the techniques described herein relate to an inverter including the power module.

In some aspects, the techniques described herein relate to a vehicle including the inverter.

In some aspects, the techniques described herein relate to a power module, including: a first substrate having an outer surface and an inner surface, the first substrate extending from a first longitudinal end toward a second longitudinal end; a semiconductor die coupled to the inner surface of the first substrate; a second substrate having an outer surface and an inner surface, the semiconductor die being coupled to the inner surface of the second substrate, the second substrate extending from a first longitudinal end toward a second longitudinal end; and a lead frame coupled to the inner surface of the first substrate, wherein a thickness of the lead frame is greater than a distance from the inner surface of the first substrate to the inner surface of the second substrate.

In some aspects, the techniques described herein relate to a system including: an inverter configured to convert DC power from a battery to AC power to drive a motor, wherein the inverter includes: a power module including: a lower substrate including a lower conductive layer extending in a lower plane; and an upper substrate including an upper conductive layer extending in an upper plane separated from the lower plane, wherein an end of the upper substrate is offset in the upper plane from a corresponding end of the lower substrate so that a normal vector from the upper plane at the end of the upper substrate does not intersect the lower substrate.

In some aspects, the techniques described herein relate to a system, further including: a first lead frame connected to the lower conductive layer, wherein at least a portion of the first lead frame is in the upper plane; and a second lead frame connected to the upper conductive layer, wherein at least a portion of the second lead frame is in the lower plane.

In some aspects, the techniques described herein relate to a system, wherein one or more of the first lead frame or the second lead frame has a thickness greater than 500 microns.

In some aspects, the techniques described herein relate to a system, wherein a distance between an inner surface of the upper substrate and an inner surface of the lower substrate is less than 500 microns.

In some aspects, the techniques described herein relate to a system, wherein a length of the lower substrate is approximately equal to a length of the upper substrate.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a first substrate including a first conductive layer extending in a first plane; and a second substrate including a second conductive layer extending in a second plane separated from the first plane, wherein an end of the first substrate is offset in the first plane from a corresponding end of the second substrate so that a normal vector from the first plane at the end of the first substrate does not intersect the second substrate.

In some aspects, the techniques described herein relate to a system including: a power module for an inverter, the power module including: a lower substrate including a lower conductive layer extending in a lower plane; an upper substrate including an upper conductive layer extending in an upper plane separated from the lower plane; a first lead frame connected to the lower conductive layer, wherein at least a portion of the first lead frame is in the upper plane; and a second lead frame connected to the upper conductive layer, wherein at least a portion of the second lead frame is in the lower plane.

In some aspects, the techniques described herein relate to a system including: an inverter configured to convert DC power from a battery to AC power to drive a motor, wherein the inverter includes: a first power module, the first power module including: a first substrate including a first conductive layer; a second substrate including a second conductive layer; a power switch between the first conductive layer and the second conductive layer, the power switch including a gate connection, wherein the power switch is configured to selectively electrically connect the first conductive layer to the second conductive layer based on a signal to the gate connection; and a point-of-use controller between the first conductive layer and the second conductive layer, the point-of-use controller configured to provide the signal to the gate connection to control the power switch.

In some aspects, the techniques described herein relate to a system, wherein the first power module further includes: a first lead frame connection; and a second lead frame connection, wherein the point-of-use controller is on the first substrate between the first lead frame connection and the second lead frame connection.

In some aspects, the techniques described herein relate to a system, wherein the first power module further includes: an electrically conductive spacer between the first substrate and the second substrate, wherein the first lead frame connection is connected to the first power switch via the electrically conductive spacer.

In some aspects, the techniques described herein relate to a system, wherein the first power module further includes: a flex layer between the first substrate and the second substrate, wherein the point-of-use controller is connected to the gate connection via the flex layer.

In some aspects, the techniques described herein relate to a system, wherein the first power module further includes: a control connection, wherein the first point-of-use controller is connected to the control connection via the flex layer.

In some aspects, the techniques described herein relate to a system, wherein the power switch includes one or more silicon carbide dies.

In some aspects, the techniques described herein relate to a system, wherein the inverter further includes: a second power module; and a third power module.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a first substrate including a first conductive region and a second conductive region; a second substrate including a third conductive region and a fourth conductive region; a first power switch between the first substrate and the second substrate, the first power switch including a first gate connection, wherein the first power switch is configured to selectively electrically connect the first conductive region to the third conductive region based on a first signal to the first gate connection; and a first point-of-use controller between the first substrate and the second substrate, the first point-of-use controller configured to provide the first signal to the first gate connection to control the first power switch.

In some aspects, the techniques described herein relate to a system, wherein the power module further includes: a second power switch between the first substrate and the second substrate, the second power switch including a second gate connection, wherein the second power switch is configured to selectively electrically connect the second conductive region to the fourth conductive region based on a second signal to the second gate connection.

In some aspects, the techniques described herein relate to a system, wherein the power module further includes: a second point-of-use controller between the first substrate and the second substrate, the second point-of-use controller configured to provide the second signal to the second gate connection to control the second power switch.

In some aspects, the techniques described herein relate to a system, wherein the power module further includes: a first lead frame connection; and a second lead frame connection, wherein the first point-of-use controller is on the first substrate between the first lead frame connection and the second lead frame connection.

In some aspects, the techniques described herein relate to a system, wherein the power module further includes: an electrically conductive spacer between the first substrate and the second substrate, wherein the first lead frame connection is connected to the first power switch via the electrically conductive spacer.

In some aspects, the techniques described herein relate to a system, wherein the power module further includes: a flex layer between the first substrate and the second substrate, wherein the first point-of-use controller is connected to the first gate connection via the flex layer.

In some aspects, the techniques described herein relate to a system including: a power module for an inverter, the power module including: a lower substrate including a lower conductive layer, the lower conductive layer including a first lower conductive region and a second lower conductive region; an upper substrate including an upper conductive layer, the upper conductive layer including a first upper conductive region and a second upper conductive region; a first power switch between the first lower conductive region and the first upper conductive region, the first power switch including a first gate connection, wherein the first power switch is configured to selectively electrically connect the first lower conductive region to the first upper conductive region based on a first signal to the first gate connection; a first point-of-use controller between the lower conductive layer and the upper conductive layer, the first point-of-use controller configured to provide the first signal to the first gate connection to control the first power switch; a second power switch between the second lower conductive region and the second upper conductive region, the second power switch including a second gate connection, wherein the second power switch is configured to selectively electrically connect the second lower conductive region to the second upper conductive region based on a second signal to the second gate connection; and a second point-of-use controller between the lower conductive layer and the upper conductive layer, the second point-of-use controller configured to provide the second signal to the second gate connection to control the second power switch.

In some aspects, the techniques described herein relate to a system, wherein the power module further includes: a first lead frame connection; and a second lead frame connection, wherein the first point-of-use controller is on the lower substrate between the first lead frame connection and the second lead frame connection.

In some aspects, the techniques described herein relate to a system, wherein the power module further includes: a third lead frame connection, wherein the second point-of-use controller is on the lower substrate between the third lead frame connection and the second lead frame connection.

In some aspects, the techniques described herein relate to a system, wherein the power module further includes: an electrically conductive spacer between the lower substrate and the upper substrate, wherein the first lead frame connection is connected to the first power switch via the electrically conductive spacer.

In some aspects, the techniques described herein relate to a system, wherein the power module further includes: a flex layer between the lower conductive layer and the upper conductive layer, wherein the first point-of-use controller is connected to the first gate connection via the flex layer.

In some aspects, the techniques described herein relate to a system, wherein the power module further includes: a control connection, wherein the first point-of-use controller is connected to the control connection via the flex layer.

In some aspects, the techniques described herein relate to a power module, including: a first substrate having an outer surface and an inner surface, the first substrate extending from a first longitudinal end toward a second longitudinal end; a power switch including a semiconductor die, the power switch being coupled to the inner surface of the first substrate; a second substrate having an outer surface and an inner surface, the power switch being coupled to the inner surface of the second substrate, the second substrate extending from a first longitudinal end toward a second longitudinal end, wherein the first longitudinal end of the first substrate is longitudinally offset from the first longitudinal end of the second substrate; a first electrically conductive spacer coupled to the inner surface of the first substrate and to the inner surface of the second substrate; and a flex circuit coupled to the power switch.

In some aspects, the techniques described herein relate to a power module, wherein the first substrate further includes a middle layer between the inner surface and the outer surface, wherein the middle layer includes a ceramic, and the outer surface and the inner surface of the first substrate include a metal.

In some aspects, the techniques described herein relate to a power module, wherein the electrically conductive spacer is coupled to a first part of the inner surface of the second substrate, and the power switch is coupled to a second part of the inner surface of the second substrate, wherein the first part and the second part are not directly coupled to one another.

In some aspects, the techniques described herein relate to a power module, further including a second electrically conductive spacer coupled to the inner surface of the second substrate and to the inner surface of the first substrate.

In some aspects, the techniques described herein relate to a power module, wherein the semiconductor die includes silicon carbide.

In some aspects, the techniques described herein relate to a power module, wherein the second substrate further includes a middle layer between the inner surface and the outer surface, wherein the middle layer includes a ceramic, and the outer surface and the inner surface of the second substrate include a metal.

In some aspects, the techniques described herein relate to a power module, wherein a source connection of the power switch is coplanar with the connection.

In some aspects, the techniques described herein relate to a power module, wherein the power switch includes a drain, wherein the drain is coupled to the inner surface of the first substrate.

In some aspects, the techniques described herein relate to a power module, wherein the power switch includes a source, wherein the source is coupled to the inner surface of the second substrate.

In some aspects, the techniques described herein relate to a power module, wherein the flex circuit includes an insulating material and an electrically-conductive material, wherein the inner surface of the second substrate is electrically insulated from the electrically conductive material of the flex circuit.

In some aspects, the techniques described herein relate to a power module, wherein the power switch includes a gate, wherein electrical connections to the gate are contained only within the flex circuit.

In some aspects, the techniques described herein relate to a power module, wherein the power switch includes a gate, wherein electrical connections to the gate, within the power module, are contained solely within the flex circuit.

In some aspects, the techniques described herein relate to a power module, wherein the power switch includes a gate, wherein electrical connections to the gate, within the power module, do not extend through any part of the second substrate.

In some aspects, the techniques described herein relate to a power module, further including: a first connection; a second connection, wherein the power switch includes a first gate terminal, the power switch configured to control a first flow of current between the first connection and the second connection based on a first signal to the first gate terminal; and a first point-of-use controller configured to provide the first signal to the first gate terminal to control the first power switch.

In some aspects, the techniques described herein relate to an inverter including the power module.

In some aspects, the techniques described herein relate to a vehicle including the inverter.

In some aspects, the techniques described herein relate to a power module, including: a first substrate having an outer surface and an inner surface, the first substrate extending from a first longitudinal end toward a second longitudinal end; a power switch including a semiconductor die coupled to the inner surface of the first substrate, wherein the semiconductor die includes silicon carbide; a second substrate having an outer surface and an inner surface, the semiconductor die being coupled to the inner surface of the second substrate, the second substrate extending from a first longitudinal end toward a second longitudinal end, wherein the first longitudinal end of the first substrate is longitudinally offset from the first longitudinal end of the second substrate; a first electrically conductive spacer coupled to inner surface of the first substrate and to the inner surface of the second substrate; a flex circuit coupled to the semiconductor die; a first connection; a second connection, wherein the power switch includes a first gate terminal, the first power switch configured to control a first flow of current between the first connection and the second connection based on a first signal to the first gate terminal; and a first point-of-use controller configured to provide the first signal to the first gate terminal to control the first power switch.

In some aspects, the techniques described herein relate to an inverter, including the power module.

In some aspects, the techniques described herein relate to a vehicle, including the inverter.

In some aspects, the techniques described herein relate to a power module, including: a first substrate having an outer surface and an inner surface, the first substrate extending from a first longitudinal end toward a second longitudinal end; a power switch including a semiconductor die coupled to the inner surface of the first substrate, wherein the semiconductor die includes silicon carbide; a second substrate having an outer surface and an inner surface, the semiconductor die being coupled to the inner surface of the second substrate, the second substrate extending from a first longitudinal end toward a second longitudinal end, wherein the first longitudinal end of the first substrate is longitudinally offset from the first longitudinal end of the second substrate; a first electrically conductive spacer coupled to inner surface of the first substrate and to the inner surface of the second substrate; a flex circuit coupled to the semiconductor die; a first connection; a second connection, wherein the power switch includes a first gate terminal, the first power switch configured to control a first flow of current between the first connection and the second connection based on a first signal to the first gate terminal, wherein electrical connections to the first gate terminal, within the power module, do not extend through any part of the second substrate; and a first point-of-use controller configured to provide the first signal to the first gate terminal to control the first power switch.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
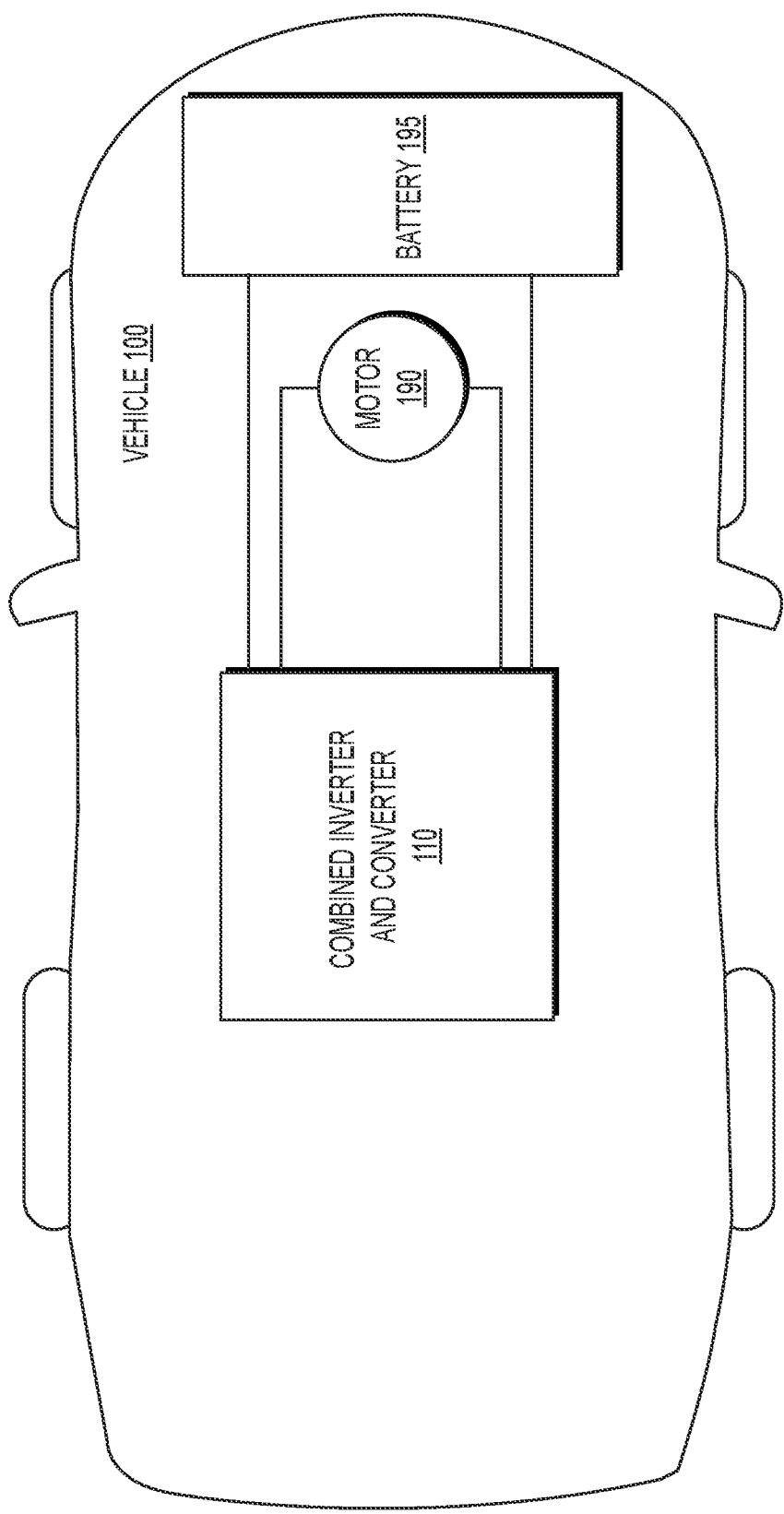
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an adaptive driver for an inverter for an electric vehicle, and, more particularly, to systems and methods for an adaptive driver for a power device switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

Half-bridge topology selection for power modules may operate with lower loop inductance, less ringing, and voltage overshoot than other topologies. Using silicon carbide metal-oxide-semiconductor field-effect transistors (SiC MOSFETs), results in reduced the switching times relative to, for example, some silicon insulated gate bipolar transistors (Si IGBT), and the reduced inductance of a half bridge module may be pursued to take advantage of that capability.

Half bridge circuits may be used in power electronics to apply pulse width modulated voltage in controlling the current applied to inductive loads such as motors. In such a circuit, the source and its related circuits may most naturally be on the opposing substrates for the two switches in the half bridge. That is, in a half bridge circuit, the source of the upper switch and drain of the lower switch may share a common connection with the load, and the source and drain may be on opposite sides of a bare die that are used in power applications. For high voltage, dual side cooled applications, the source and the drain may be cooled at their interconnects, through an insulating substrate, with the drain being on one substrate and the source being on the other.

Each power device in the bridge may have circuits referenced to the source connection. However, having the sources on opposing substrates in a dual side cooled package may cause difficulties for assembly. For example, bottom-up assembly for dual side cooled modules may be compromised, as each substrate and its source referenced circuit must be assembled separately and then brought together. In addition, the die associated with the lowers would be inverted from those of the uppers, but the source and drain interconnects may have different voltage standoff requirements, causing differences at the interconnect, which could cause issues with co-planarity during assembly.

Such difficulties during assembly may lead to lower yields and higher costs. In addition, some devices may face issues of efficiency related to paths for heat and current.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
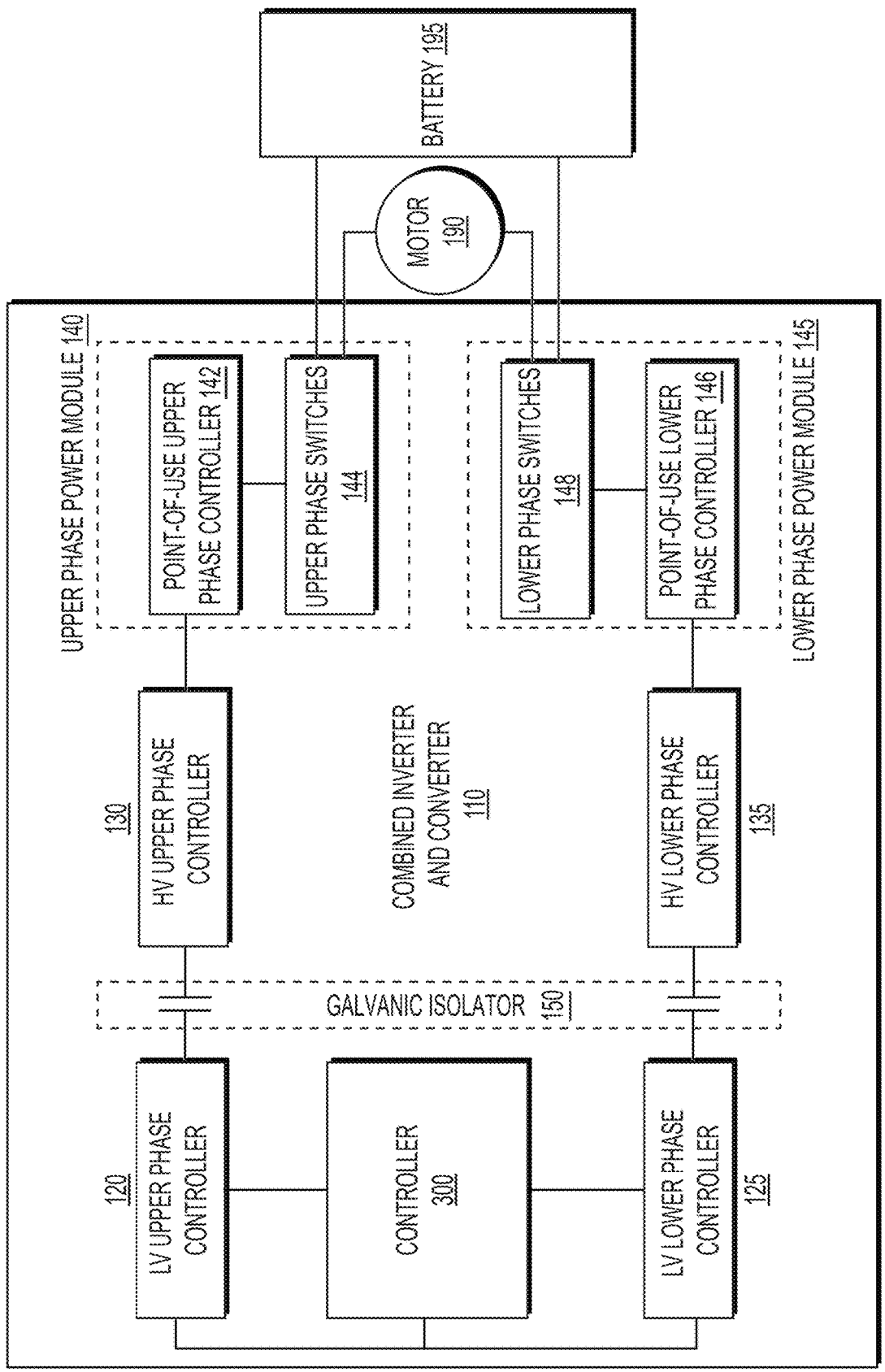
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
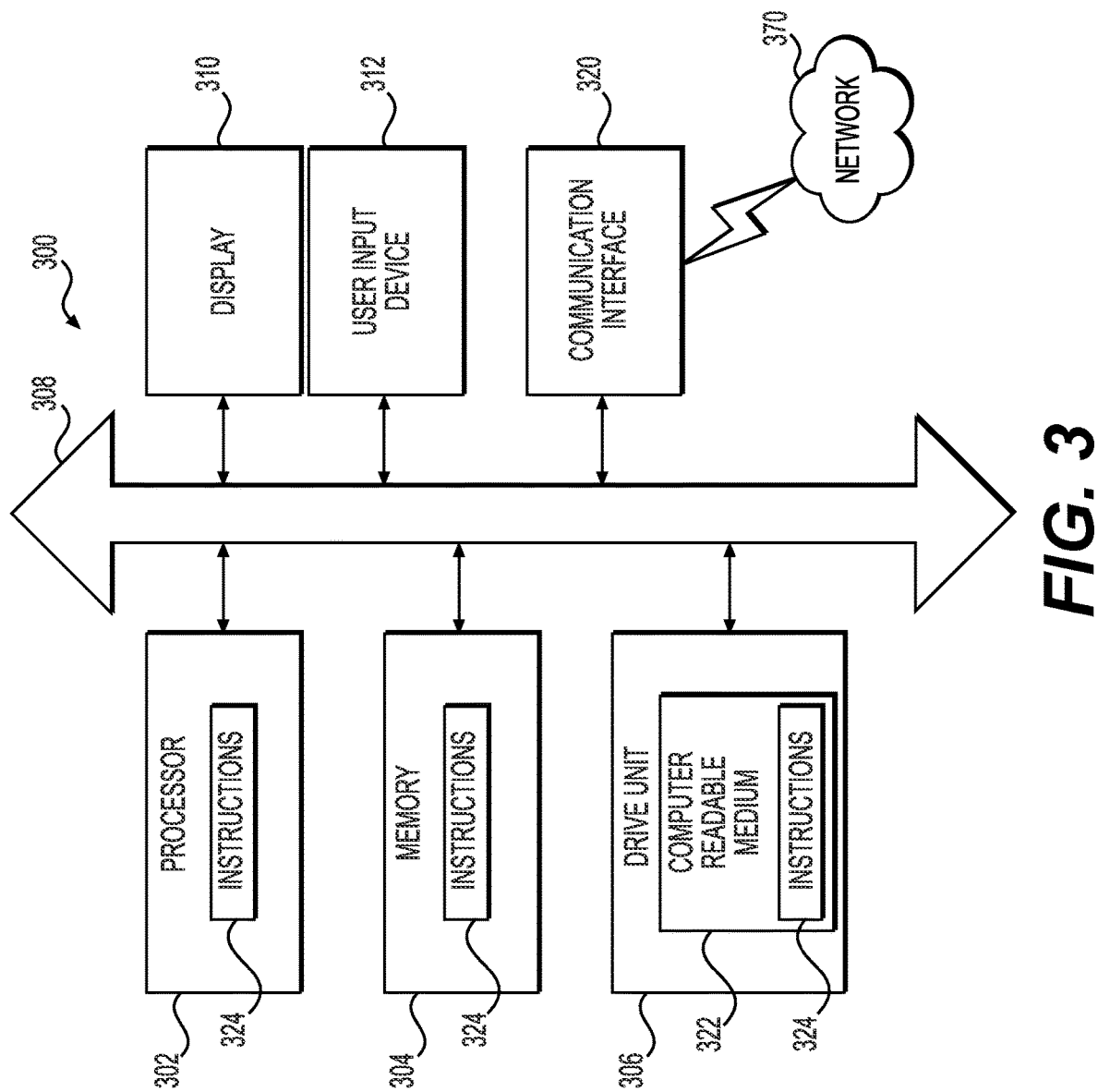
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a DC to DC converter, an AC to DC converter, a charger, a DC to AC converter for controlling a motor and providing AC power, a personal computer (PC), a mobile device, a laptop computer, a desktop computer, a communications device, a control system, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed) or automatically.

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include and/or interface to a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306, such as for programming, for example.

Additionally or alternatively, the inverter controller 300 may include an input device 312 configured to allow a user to interact with any of the components of inverter controller 300, such as for calibrating or testing, for example. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive, flash memory, or any medium that is capable of storing, encoding, or carrying a set of instructions for execution by the inverter controller 300. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network, for example. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Controller Area Network (CAN), FlexRay™, Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
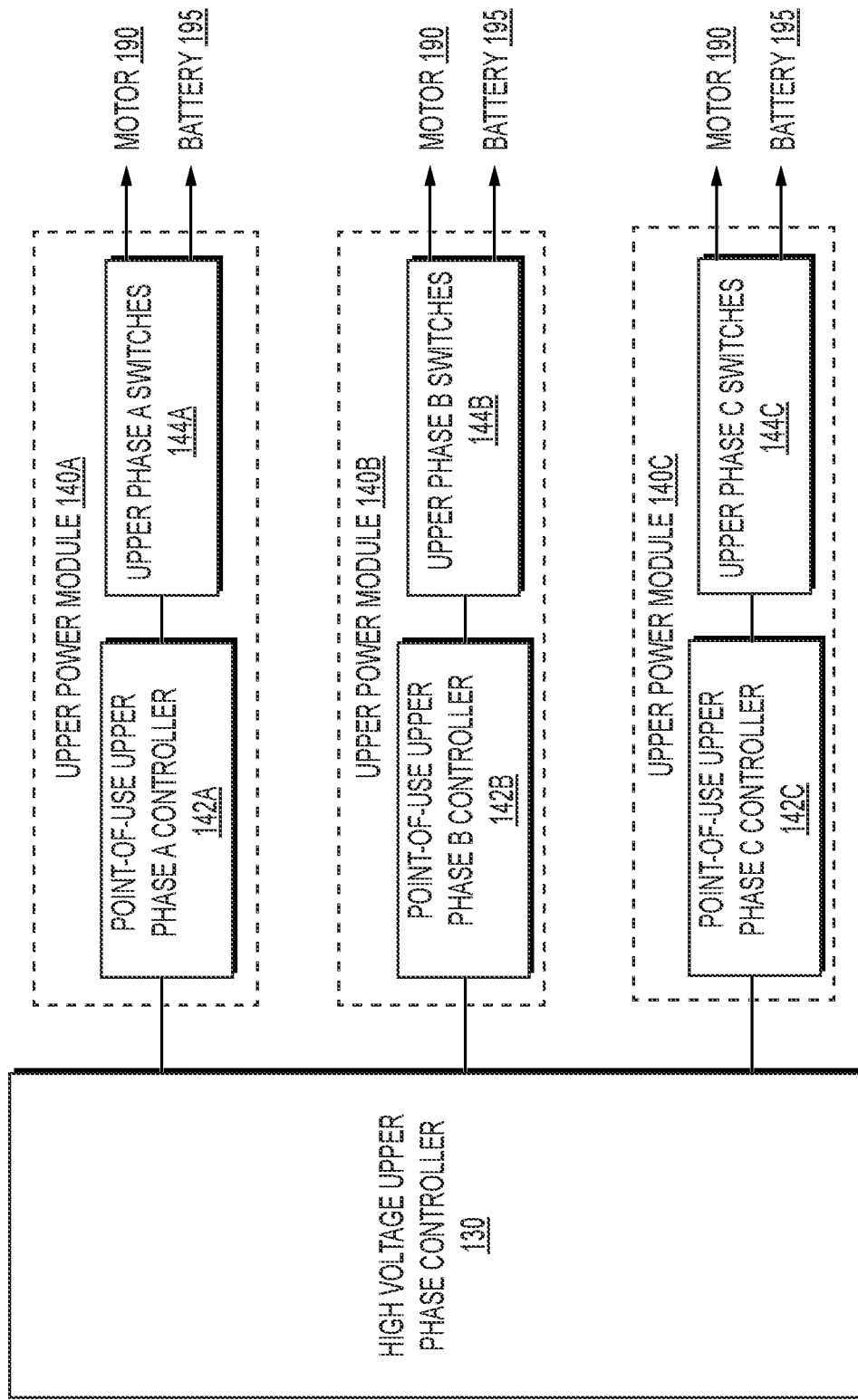
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
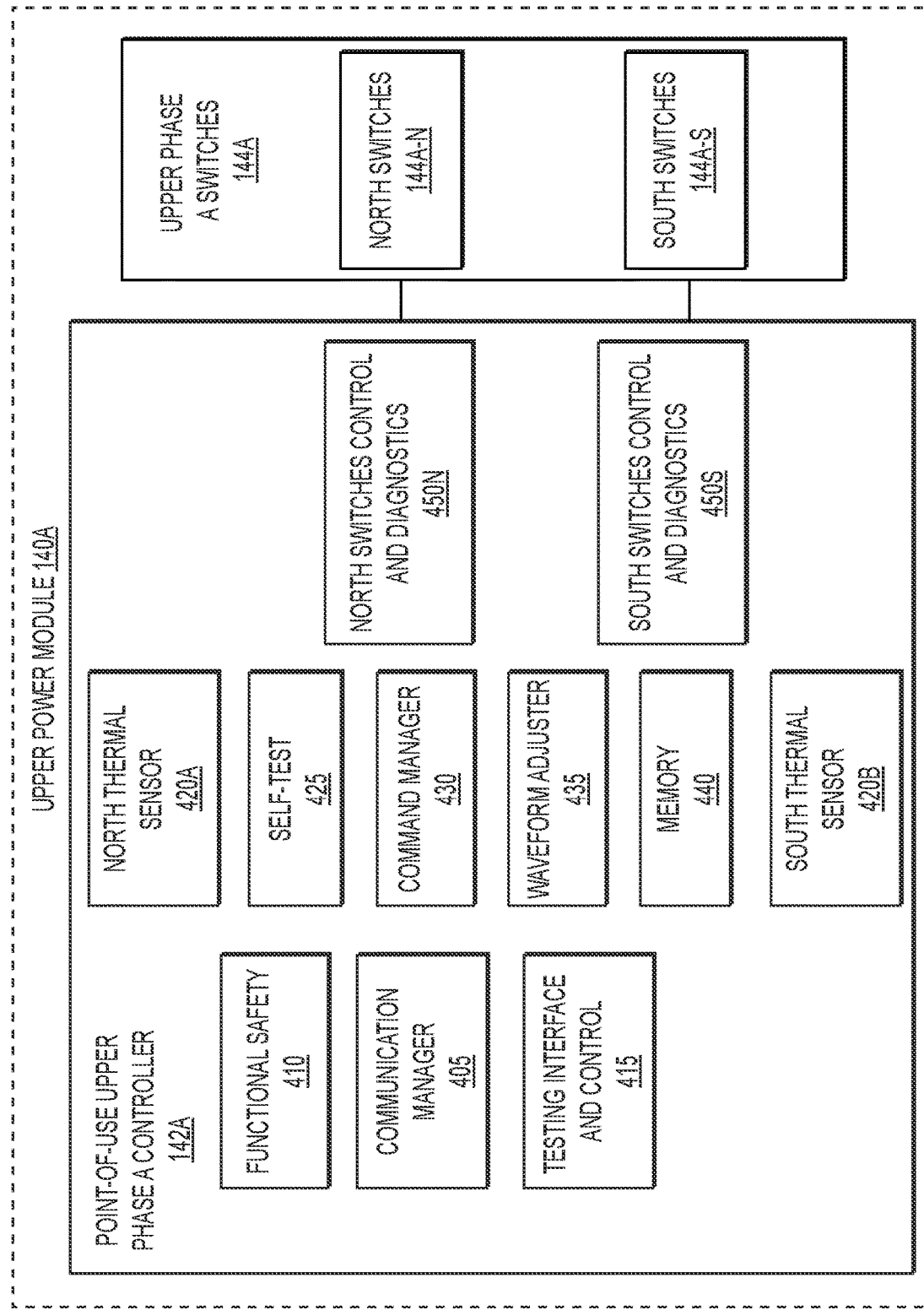
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
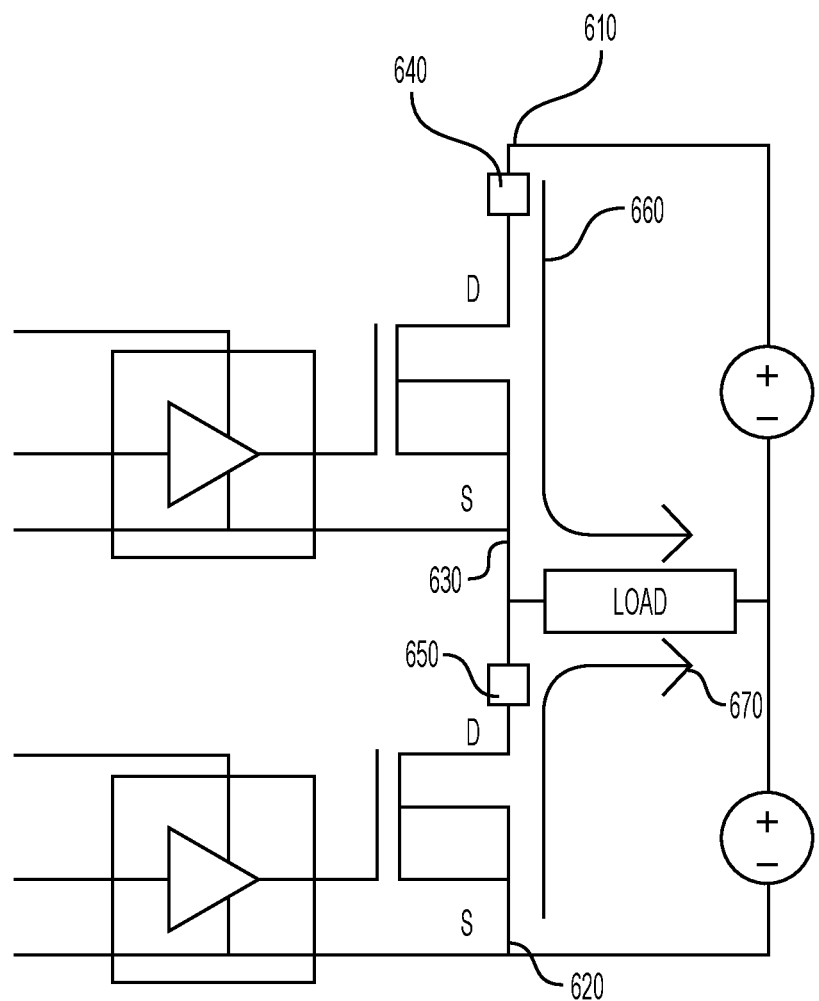
FIG. 6 depicts an exemplary electrical schematic for a power module including electrically conductive spacers, according to one or more embodiments.
Figure 7:
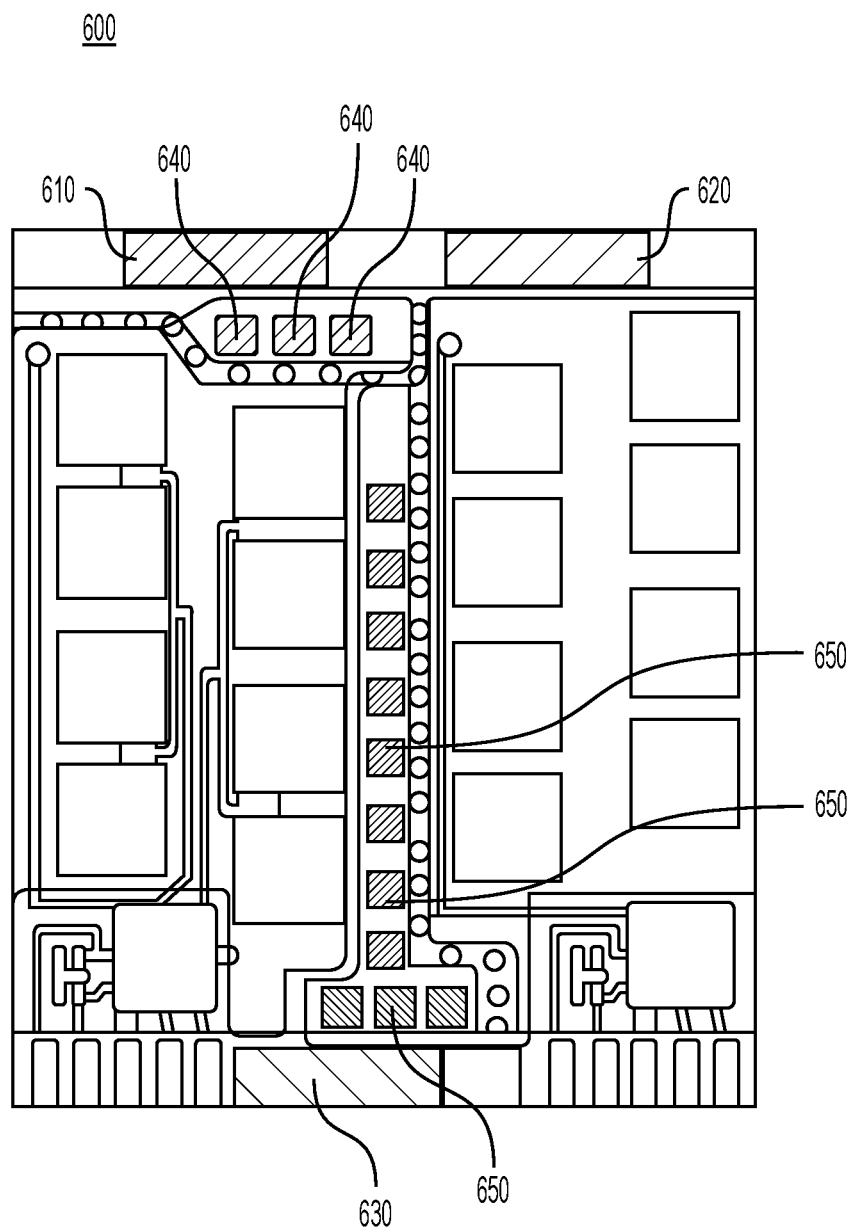
FIG. 7 depicts an exemplary architecture for a power module including electrically conductive spacers, according to one or more embodiments.

FIG. 6 depicts an exemplary electrical schematic for a power module including electrically conductive spacers, according to one or more embodiments. FIG. 7 depicts an exemplary architecture for a power module including electrically conductive spacers, according to one or more embodiments.

As discussed above, application of half-bridge topology for power modules may present difficulties during assembly, and possibly leading to lower yields and higher costs. In addition, some devices may face issues of efficiency related to paths for heat and current. Power modules according to one or more embodiments may overcome these challenges through use of electrically conductive spacers. The spacers may be formed of copper, for example, or another electrically and/or thermally conductive material. The spacers may provide a connection between a first substrate and a second substrate. A spacer may be 2 mm by 2 mm, for example, and may have a thickness similar to that of a die, such as 180 µm, for example. The spacers may be surface mount components and placed along with SiC MOSFETs using a same process. The spacers may replace wires and clips that some systems may use, and die interconnects may allow the gate, drain, and source to be connected to the same substrate.

Electrically conductive spacers may be employed in a half-bridge topology for a power module, which may provide for reduced loop inductance in the device. Reduced loop inductance may, in turn, provide less ringing and less voltage overshoot. An application of the device may then speed up the switching time, reduce the power, and may offer more current throughput at a given price and performance point.

Electrically conductive spacers may provide a path for current flow from a first substrate to a second substrate, thus allowing source referenced circuits to be assembled to one (e.g., exactly one, only one, or no more than one) substrate. The electrically conductive spacers may be compatible with methods used to make connections to both sides of a die, such as by sinter or solder interconnect, for example. The electrically conductive spacers may thus allow current to flow between the two substrates, as shown in FIG. 6.

The power flow in a cooled power module 600 according to one or more embodiments is shown in FIG. 6 and FIG. 7 in schematic and planar view, respectively. As shown in the figures, the interconnects 610, 620, and 630 may be on a lower or first substrate providing a source plane. Current may, thus, flow along path 660 from the interconnect 610 from the lower (source) substrate to an upper or second substrate providing a drain plane, through electrically conductive spacers 640 and to drains of a first group of parallel SiC MOSFETs (e.g. upper phase switches 144). The drains of the first group of parallel SiC MOSFETs may be attached to the drain plane on a first side (the left side in FIG. 7) of the upper (drain) substrate. During a first half-cycle, current may be switched (by turning on the first group of parallel SiC MOSFETs) through, drain to source, the first group of parallel SiC MOSFETs to the lower (source) substrate, where the source plane on the first or left side of the lower (source) substrate allows current to flow out of the interconnect 630 to the load, e.g., to motor 190.

During the next half cycle, current may flow along path 670 from interconnection 620 and along the source plane on a second side (the right side in FIG. 7) of the lower (source) substrate. The current may be switched (by turning on the first group of parallel SiC MOSFETs) through, source to drain, the second group of parallel SiC MOSFETs to the upper (drain) substrate, through the drain plane on the second or right side of the upper (drain) substrate, and through the electrically conductive spacers 650 to the lower (source) substrate and the load.

If such a half-bridge arrangement is used in an inverter, the current flow may be in either direction through the devices to the load. That is, current flow may be through path 660 or path 670, as depicted in FIG. 6.

Figure 8:
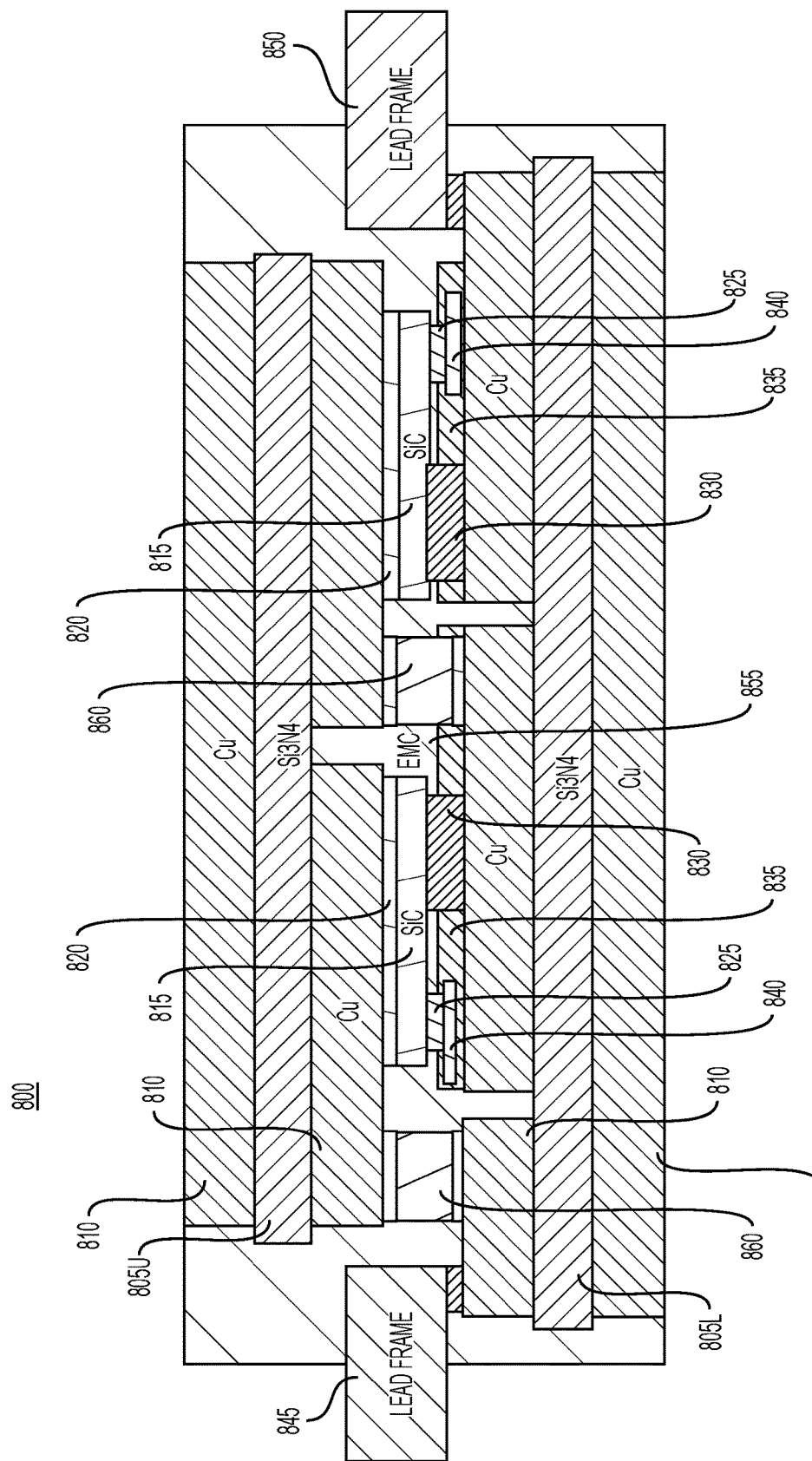
FIG. 8 depicts a cross-section view of an exemplary architecture for a power module including electrically conductive spacers, according to one or more embodiments.

FIG. 8 depicts a cross-section view of an exemplary architecture for a power module 800 including electrically conductive spacers 860, according to one or more embodiments. Power module 800 may be a dual-side-cooled power module according to one or more embodiments is depicted in FIG. 8 in cross-section view.

A dual-side-cooled power module 800 according to one or more embodiments may provide a high current interconnect between a base substrate and cap substrate for a dual-side-cooled power module. However, while some embodiments herein are referred to as "dual-side cooled", it is contemplated that the devices disclosed herein may be used in "single-side cooled" applications or combined active/passive cooling configurations. As shown in FIG. 8, upper substrate 805U and lower substrate 805L, both of ceramic, e.g., silicon nitride ($Si_3N_4$) middle layers having thick metallization, e.g., direct bond copper (DBC) or active metal brazing (AMB) 810 that may be employed on an outer surface and an inner surface of the ceramic middle layer. Each of the metallization layers 810 may include multiple conductive regions electrically separated from each other, as shown in FIG. 8. The power module 800 may include a semiconductor (e.g., silicon carbide (SiC)) die 815 that has a drain connection 820 to the upper substrate 805U. The source connection 830 may be attached to the lower substrate 805L. A polyimide or flex circuit 835 including a base polyimide material with an internal copper layer 840 may be used, thus making interconnect possible to the gate connection 825 of the SiC MOSFET 815. Other components depicted in FIG. 8 may include a lead frame connection 845 for the positive supply voltage (from battery 195, for example), and a lead frame connection 850 for the negative supply voltage. The assembly may be over-molded with a dielectric material 855. The module may include one or more electrically conductive spacers 860 that provide high current interconnect between an inner surface of upper substrate 805U and an inner surface of lower substrate 805L.

Figure 9:
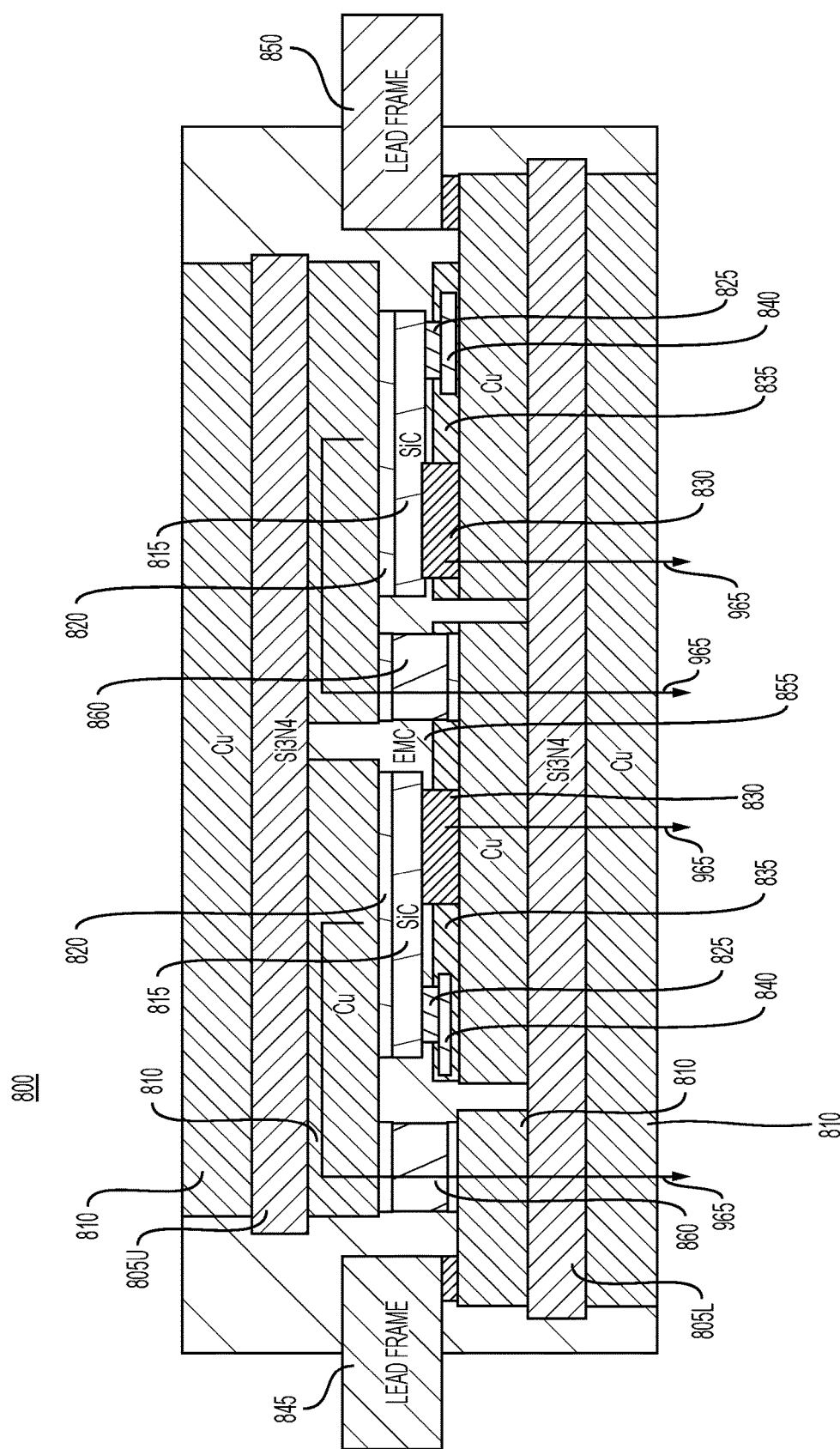
FIG. 9 depicts a single-sided cooling heat flow in a cross-section view of an exemplary architecture for a power module including electrically conductive spacers, according to one or more embodiments, in cross-section view.

FIG. 9 depicts a single-sided cooling heat flow in a cross-section view of an exemplary architecture for a power module 800 including electrically conductive spacers, according to one or more embodiments, in cross-section view. As shown in FIG. 9, the electrically conductive spacers 860 may allow heat to flow between upper substrate 805U and lower substrate 805L.

As shown in FIG. 9, if the lower substrate 805L only is used as the thermal sink, the heat from the upper substrate 805U has a conductive path to an outer surface of the lower substrate 805L by way of the various electrically conductive spacers 860, thus reducing the overall thermal impedance. The heat paths from the upper substrate 805U and SiC MOSFETs 815 to the lower substrate 805L are shown by the arrows 965 in FIG. 9.

A dual-side-cooled power module 800 according to one or more embodiments may include use of electrically conductive spacers 860 in conjunction with a second-level metal, such as polyimide or flex circuit 835, to achieve a low inductance half H-bridge topology. The configuration of a dual-side-cooled power module 800 according to one or more embodiments, as discussed above, enables the placement of source referenced circuits onto a single substrate (e.g. a first SiC MOSFET 815 with a drain-to-source current path and a second SiC MOSFET 815 with a source-to-drain current path may both be similarly placed, without inversion relative to each other, on a lower substrate serving as a source plane). This configuration, thus, allows for bottom-up assembly and is compatible with Design for Manufacturing (DFM) objectives. Likewise, the electrically conductive spacers 860 used in this configuration enable all module high current interconnects (e.g. lead frame connection 845 for the positive supply voltage and lead frame connection 850 for the negative supply voltage, or interconnects 610, 620, and 630) to be made on one substrate (e.g. lower substrate 805L), thus improving overall efficiency of the device.

Figure 10:
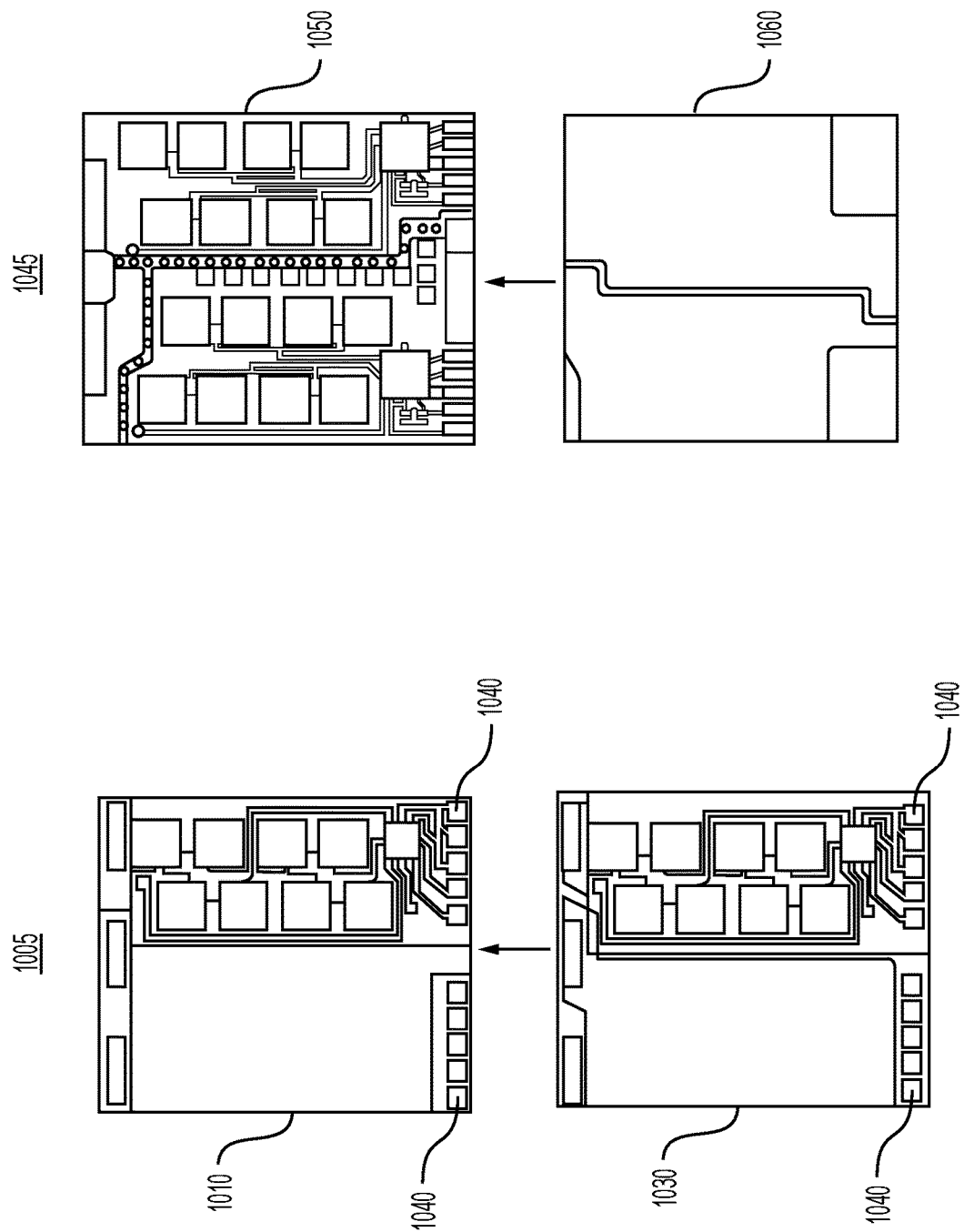
FIG. 10 depicts an assembly of a power module with devices on two substrates and an assembly of an exemplary power module with devices on a single substrate, according to one or more embodiments.

FIG. 10 depicts an assembly of a power module with devices on two substrates and an assembly of an exemplary power module with devices on a single substrate, according to one or more embodiments. FIG. 10 depicts differences in assembly between a device 1005 and a dual-side-cooled power module 1045 according to one or more embodiments.

A device 1005 may include components 1040 placed on both a top (top of FIG. 10) substrate 1010 and a bottom (bottom of FIG. 10) substrate 1030, where the assembly includes a drain connection for half the switches and a gate/source connection for half the switches. Compared to the manufacture of the separate components, the blind interconnect of the separate substrates when the top substrate is assembled to the bottom is difficult because the geometry of the interconnects are different. In a device 1005, all source components may be assembled, half of the components may be placed on each of the two substrates, and the source and gate connections may be made as shown. Next, one substrate may be flipped and the drain connection on the top on one half and the drain connection on the bottom on the other half are then made. Corresponding geometry interconnects must be made with half of the interconnects on the top and half on the bottom. In dual-side-cooled power module 1045, all the MOSFETs may be facing the same way. The interconnects made while assembling the first substrate may be identical. The second substrate may have no components, and all the interconnects made during the substrate to substrate attachment may be similar. Electrically conductive spacers 860 may provide an electrical connection from one substrate to the other.

In a device 1005 having components 1040 placed on both a top (top of FIG. 10) substrate 1010 and a bottom (bottom of FIG. 10) substrate 1030, during assembly, the two substrates must be joined, face-to-face, such that necessary electrical connections between the components 1040 on the top substrate 1010 and bottom substrate 1030 are made. For example, connections between gates may be only 1 millimeter by 1 millimeter, requiring precise alignment of the top substrate 1010 and bottom substrate 1030. Improper registration during assembly may lead to production loss and higher costs. A dual-side-cooled power module 1045 according to one or more embodiments, as depicted in FIG. 10, may provide all components placed on a single (e.g., exactly one, only one, or no more than one) substrate, such as top substrate 1050, for example, thus avoiding issues of improper registration during assembly when the top substrate 1050 is joined with bottom substrate 1060.

In addition, the electrically conductive spacers 860 may be both electrically and thermally conductive, thus providing a thermal conduction path from top substrate 1050 to bottom substrate 1060. Although the thermal path through the electrically conductive spacers 860 may be less efficient than a thermal path directly through each substrate, use of this thermal path through the electrically conductive spacers 860 may enable single sided cooling in lower power applications.

Further, the electrically conductive spacers 860 used in this configuration may be of small geometry and may use a small amount of extra space in the circuit topology, and may not significantly compromise the drain and source planes, the power module size, or the power module overall loop inductance.

Accordingly, the use of electrically conductive spacers 860 in a dual-side-cooled power module 800 according to one or more embodiments, as discussed above, may provide advantages in device efficiency without incurring significant compromises.

Figure 11:
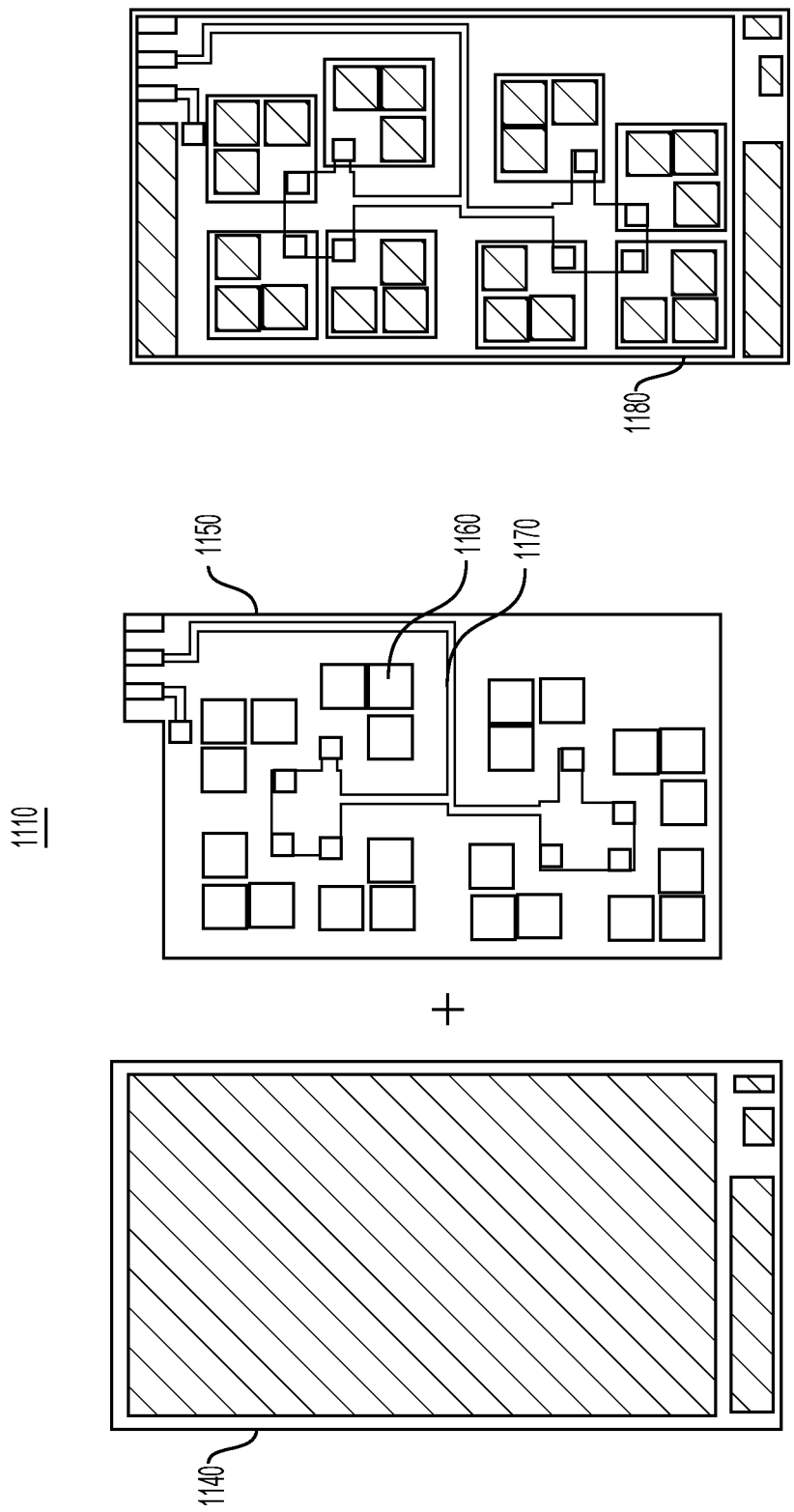
FIG. 11 depicts an assembly of an exemplary power module including a substrate layer and a flex layer, according to one or more embodiments.

FIG. 11 depicts an assembly of an exemplary power module 1110 including a substrate 1140 and a flex layer 1150, according to one or more embodiments. For dual-side-cooled power module and switch applications desiring a high power density, a second routing layer may be employed such that the gate connection does not interfere with either (a) the current capability of the source connection, or (b) the thermal performance of the substrate in increasing a thermal impedance of the substrate.

FIG. 11 depicts a layered construction of such a power module according to one or more embodiments. As shown in FIG. 11, a power module 1110 according to one or more embodiments may include a substrate 1140 and a polyimide flex layer 1150. The flex layer 1150 may include a second layer of metal including the gate routing 1170. Openings 1160 may receive gate pads of the die (e.g. lower phase switches 148). The substrate 1140 may be combined with flex layer 1150 to form a flex on substrate 1180.

The flex on substrate 1180 may route the gate connection without compromising the source connection, and may reduce or eliminate cuts in the source plane that may otherwise be needed to route the gate signals. The flex on substrate 1180 may reduce electrical impedance for the source and gate, and may eliminate gate voltage offsets and their effects that may be produced by the impedance in the source path. The flex on substrate 1180 may not compromise the source thermal path as the connections are made through the polyimide.

Figure 12:
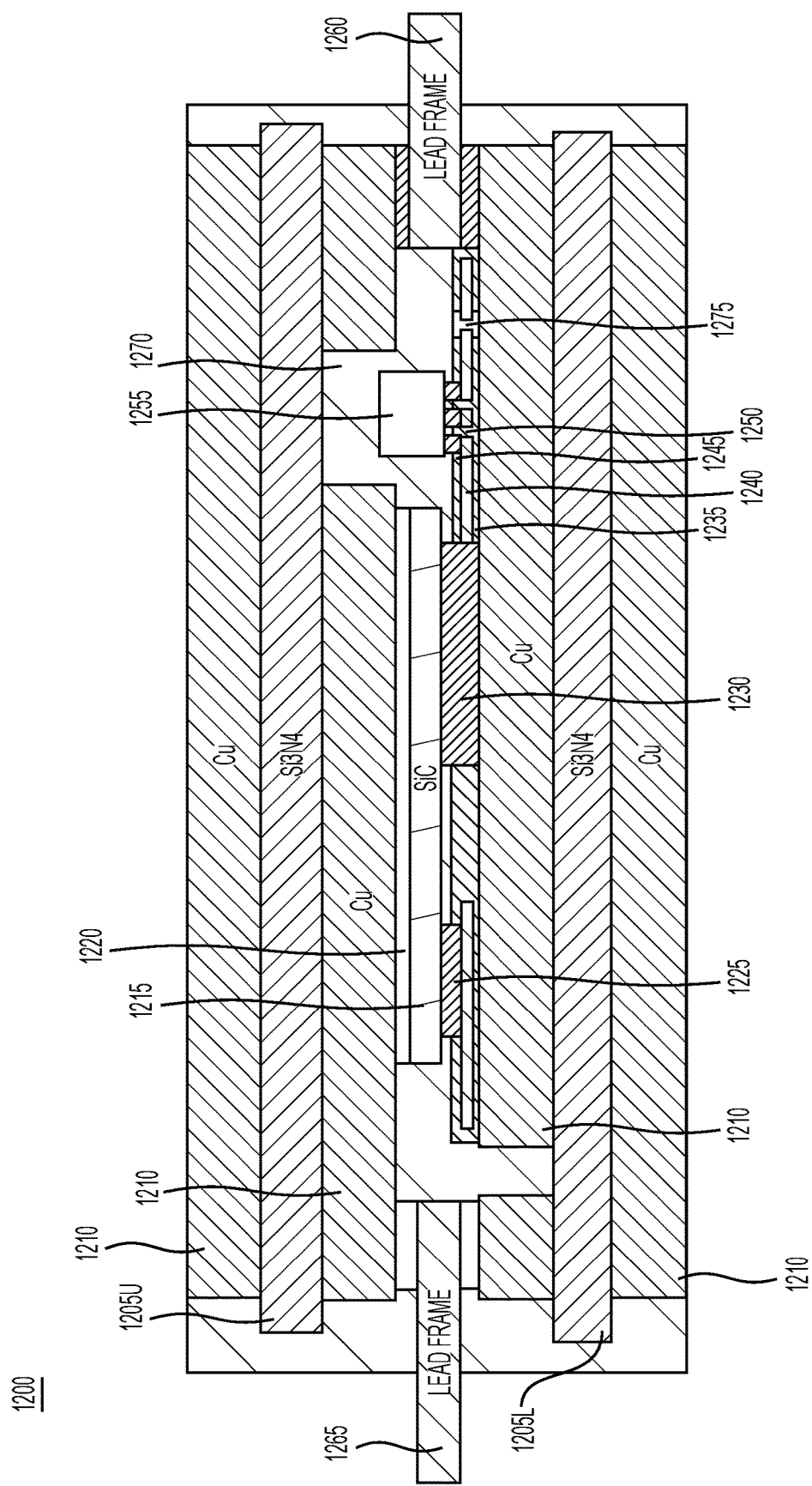
FIG. 12 depicts a cross-section view of an exemplary architecture for a power module including a surface mount component, according to one or more embodiments.

FIG. 12 depicts a cross-section view of an exemplary architecture for a power module including a surface mount component, according to one or more embodiments. According to one or more embodiments, a second metal layer may be employed by a power module 1200. As shown in FIG. 12, in cross section, the power module 1200 may include upper substrate 1205U and lower substrate 1205L, both of ceramic, e.g., silicon nitride ($Si_3N_4$) having thick metallization, e.g., direct bond copper (DBC) or active metal brazing (AMB) 1210 may be employed. Upper substrate 1205U and lower substrate 1205L may be similar to upper substrate 805U and lower substrate 805L discussed above. The dual-side-cooled power module 1200 may further include a SiC die 1215 (e.g. upper phase switches 144) that may have a drain connection 1220 to the upper substrate 1205U. The source connection 1230 may, as shown in FIG. 12, be attached to the lower substrate 1205L. A polyimide or flex circuit, which may include a base polyimide material 1235 with an internal copper layer 1240 and a coverlet 1245, may provide an interconnect (as shown in FIG. 11, for example) to the gate 1225 of the SiC MOSFET. The polyimide or flex circuit may further include, for example, a surface mount component 1255 such as, for example, a temperature sensor, thermistor, capacitor, resistor, or another integrated circuit (IC), such as a gate driver, etc. The dual-side-cooled power module 1200 may further include a lead frame connection 1265 for the drain (upper substrate 1205U) and a lead frame connection 1260 for the source (lower substrate 1205L). The assembly may be over-molded with a dielectric material 1270. The polyimide layer may provide via connections 1275 to the source plane and may also provide a solder stop 1250 for various components.

Although the use of a polyimide layer is depicted as an example implementation, alternate constructions using printed and fired conductive layers, such as, for example, silver (Ag) alloys, could also be used. A dual-side-cooled power module 1200 according to one or more embodiments may utilize solder interconnection of various components, but other methods of component interconnection, such as sintering, may be used.

A dual-side-cooled power module 1200 according to one or more embodiments may represent a mixed medium approach to a multilayer board construction, which may be similar in some respects to a rigid flex construction, but with different materials and purpose. For example, a high current, thermally conductive substrate, such as copper bonded DBC or AMB on $Si_3N_4$, Aluminum Nitride (AlN), Alumina 96% ($Al_2O_3$) or other ceramic, may be used for thermal performance, and a flex circuit laminated on top of the substrate may be used for low level signal interconnect.

A dual-side-cooled power module 1200 according to one or more embodiments, also referred to herein as "flex on substrate" (FoS), may allow the full use of the source thermal path by using openings (e.g. openings 1160) in the dielectric (e.g. flex layer 1150) to directly make connection to the lower substrate copper. For example, as shown in FIG. 11, the thin layers of polyimide may route under the die to make the gate connections without interference with the source.

An FoS construction, according to one or more embodiments, eliminates a need to cut into the source plane with the gate runners, and, thus, may allow for planed copper to be directly connected to the source for low impedance electrical connection. That is, in some embodiments, the source plane or source material of a substrate and of a power module does not include any electrical connections to the gate. Such removal of the cuts in the source plane may further minimize any warpage that might be produced due to unequal copper on front and back of the substrate. Thus, the exposed surface of the source material may be substantially continuous and smooth, without any cuts, indents, recesses, or the like. The absence of cuts can be visualized in substrate 1140 in FIG. 11.

In addition, an FoS construction, according to one or more embodiments, may further insulate the gate connection that is routed under the die, across the die edge, where a high standoff may be required due to the presence of drain voltages, and around the perimeter of the die. The presence of the polyimide may increase the dielectric strength at that point, which may reduce an overall thickness of the assembly and the thermal resistance.

An FoS construction, according to one or more embodiments, may allow circuits, the SiC gate, and other dies to be referenced to the source plane for smaller loop areas. The return path for the generated signals may be returned to the source of the signal along the source plane that exists below the routing path. That is, an FoS construction, according to one or more embodiments, may prevent disruption of the source plane that may cause electromagnetic susceptibility issues in some circuits.

An FoS construction, according to one or more embodiments, may further allow for greater trace routing density over conventional DBC or AMB designs, which may require signal routing, and which may have lines and space that are limited due to the copper thickness.

Figure 13:
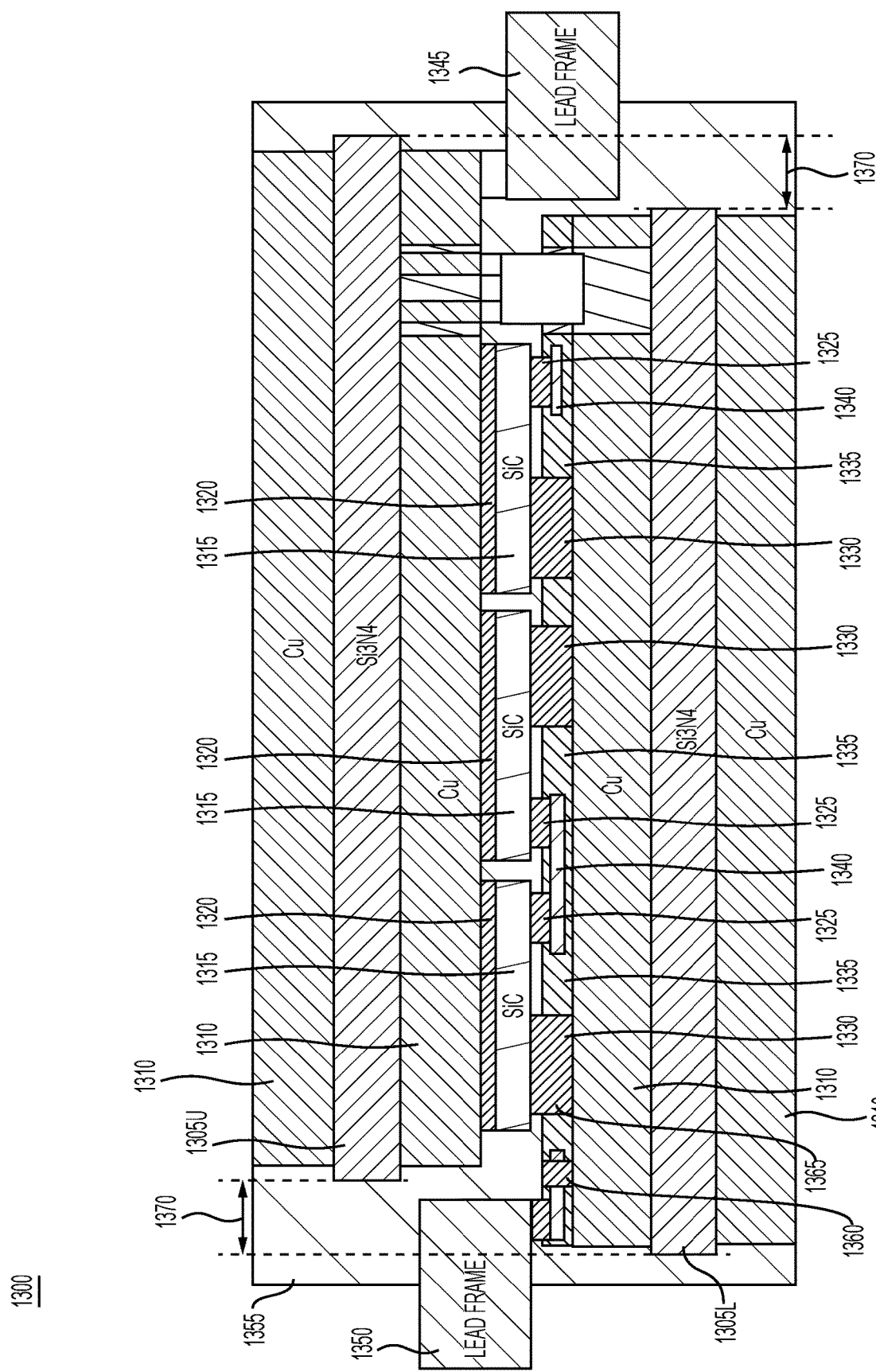
FIG. 13 depicts a cross-section view of an exemplary architecture for a power module including a shifted substrate, according to one or more embodiments.

FIG. 13 depicts a cross-section view of an exemplary architecture for a power module 1300 including a shifted substrate, according to one or more embodiments. A dual-side-cooled power module according to one or more embodiments may represent a general methodology and resultant topology shift in maximizing the load current capability of a high current power module used in bridge applications such as a three phase traction inverter, without compromising the dual-side cooling and the overall material thickness within the cooling path.

The limitations of any semiconductor power switch are based upon allowed temperature rise of the die, the temperature capability of the die attach material, and the temperature of the cooling system. The losses associated with switching the required load current are applied to the conductive thermal impedance, and result in a temperature rise at the junction of the SiC FET/IGBT. This temperature rise is to be constrained and must remain within allowable temperature limitations. Limitations at the high end might be somewhat lower than the maximum die temperature. For example, a module may have transient excursions and temperature sensing accuracy limitations, making the actual junction temperature uncertain, so that power de-rating needs to occur at approximately 25 degrees less than that maximum. Limitations at the low end may be constrained by a 65 C max coolant temperature, but might have a fluid temperature increase within the cooling rails so that 75 C is the lower limit.

A direct way to widen the limits is to move the upper boundary, as it may not be constrained by a customer requirement, but rather a supplier requirement. For example, some suppliers allow the maximum junction of the die to be increased from 175C to 185C, but the die attach and the rest of the thermal stack should be considered.

Another method of increasing current density is to reduce switching losses. A SiC die is an enabler for reduced switching times. However, improved gate control is necessary to take advantage of the improvement. Improved gate control can reduce switching time, while controlling overshoots with dynamic control of the gate current during the turn-on and turn-off events. Issues with voltage drops across the source plane are inherent at high currents.

Improved gate control relies on being able to dynamically control the current during turn-on and turn-off and requires a low gate loop inductance. A second metal layer, including a polyimide flex material bonded over the source DBC/AMB copper may be employed by a dual-side-cooled power module according to one or more embodiments, thus enabling a reduced loop area for the gate current and its return current.

Exposing both the source and drain side of a die to a thermal sink in dual side cooling would ideally halve the thermal impedance. However, with the smaller source surfaces, and the drain side having a larger thermal impedance through the device itself, the thermal impedance may be estimated at six tenths of a design using only drain side cooling, as most power modules do. If the magnitude of a thermal resistance for one path out of a die is the length of that thermal path divided by the material conductivity and area, then the only difference being considered out of a second path for a dual side cooled die may be that the full area is not available because of the gate. If 75% of the area is available, the thermal resistance being 4/3 the original thermal resistance results in a parallel combination of the two thermal resistances of (4/3/(1+4/3)) times the original thermal resistance, or 0.57 of the original single sided thermal resistance. If 50% of the area is available, the thermal resistance being twice the original thermal resistance, then the parallel combination becomes (2/(1+2) times the original thermal resistance, or 0.66 the original value, where a best combined resistance is 0.5 the original value.

A die, being a flattened rectangular solid object, may only have two sides for cooling. Some systems cool the drain side of the die, as there are no obstructions on this side. The source side of the die, however, has some area dedicated to the gate signal and some are for the source. Some systems may routing the gate signals out, while avoiding close proximity to drain voltages and without contacting the source, using a loop of wire from the gate to the drain side substrate. This results in a high current source connection requiring some space to avoid contact with the wire loop. Any component in series with the source to make an electrical connection may increase the thermal resistance of the source connection, and increase the overall thermal impedance. Using wire-bonds and clips interferes with the ability to use dual side cooling. Therefore, embodiments of this disclosure do not use any wire-bonds or clips within the power module. The second metal layer that provides the gate connection must not interfere with the thermal path of the source. If the source attach requires a pedestal to provide clearance for the gate attach, the increased thermal resistance of this pedestal counters some of the benefit of dual sided cooling.

A dual-side-cooled power module 1300 according to one or more embodiments may utilize voided areas in the polyimide to enable direct connection of the source to the source plane of the DBC, while the gate layer is connected to the second metal of the polyimide flex circuit. In general, reduction of the power module thickness and the use of materials having higher thermal conductivity also allows current capabilities to be increased. The use of clips and spacers in series with the source and drain connection increases the thermal impedance. Use of channels in the DBC copper to route gate traces increase the warpage of the substrate that needs to be accommodated at some point in the thermal stack.

A dual-side-cooled power module according to one or more embodiments may increase the upper temperature boundary condition by utilizing SiC MOSFETs with higher junction temperature to increase the upper temperature limit and increase the die size to 5.5 mm×5.5 mm, for example, and modify the thermal stack so the materials do not exceed the specified capability. A dual-side-cooled power module according to one or more embodiments may utilize an internal ASIC for temperature sensing without a custom SiC FET or thermistors. Such a configuration may support temperature sensing of upper and lower phases of a half-H switch without the use of a thermistor, which may have poor accuracy. One or more embodiments may use an ASIC to accurately sense temperature, but the use of thermistors or SiC/IGBT devices with temperature sensing are not precluded.

A dual-side-cooled power module according to one or more embodiments may reduce switching losses by employing an ASIC for dynamic gate control. The power module may further support multiple pins for gate control. A dual-side-cooled power module according to one or more embodiments may employ a second metal layer for gate routing in order to enable dynamic control of the gate voltage. Such a second metal layer may enable low gate loop inductance, and may enable the source plane to be an efficient signal return path. Polyimide offers very high dielectric breakdown of 200 kV/mm.

A dual-side-cooled power module according to one or more embodiments may obtain decreased thermal resistance through material thickness reduction and use of high thermal conductivity materials to allow high currents in the switching devices. Polyimide avoids attachment of drain or source connection to anything other than the DBC, and does not require spacers from the source to the surface of the substrate or the use of wire-bonds or clips. Polyimide may reduce or minimize routing on the DBC/AMB substrate to avoid warpage, thus effecting a planar contact to the heat rail.

As shown in FIG. 13, dual-side-cooled power module 1300 according to one or more embodiments may include upper substrate 1305U and lower substrate 1305L, both of ceramic, e.g., silicon nitride ($Si_3N_4$) having thick metallization, e.g., direct bond copper (DBC) or active metal brazing (AMB) 1310. The dual-side-cooled power module 1300 may further include multiple, such as eight, for example SiC dies 1315 that may have a drain connection 1320 to the upper substrate 1305U. The source connection 1330 may, as shown in FIG. 13, be attached to the lower substrate 1305L.

A polyimide or flex circuit, which may include a base polyimide layer 1335 with an internal copper layer 1340, may provide an interconnect to the gates 1325 of the SiC MOSFETs including SiC dies 1315. The polyimide or flex circuit may further include, for example, a surface mount component such as, for example, a temperature sensor, thermistor, capacitor, resistor, or another integrated circuit (IC) such as a gate driver, etc. The dual-side-cooled power module may further include a lead frame connection 1345 for the drain (on upper substrate 1305U) and a lead frame connection 1350 for the source (on lower substrate 1305L). The assembly may be over-molded with a dielectric material 1355. The polyimide layer 1335 may provide via connections 1360 to the source plane and may also provide solder stops 1365 for various components. As shown in FIG. 13, upper substrate 1305U may be offset 1370 from lower substrate 1305L. Such an offset 1370 may enable the use of thicker lead-frames and higher currents. The power leads 1345 and 1350 may be sintered, soldered, or ultrasonically welded to dual-side-cooled power module 1300.

Figure 14:
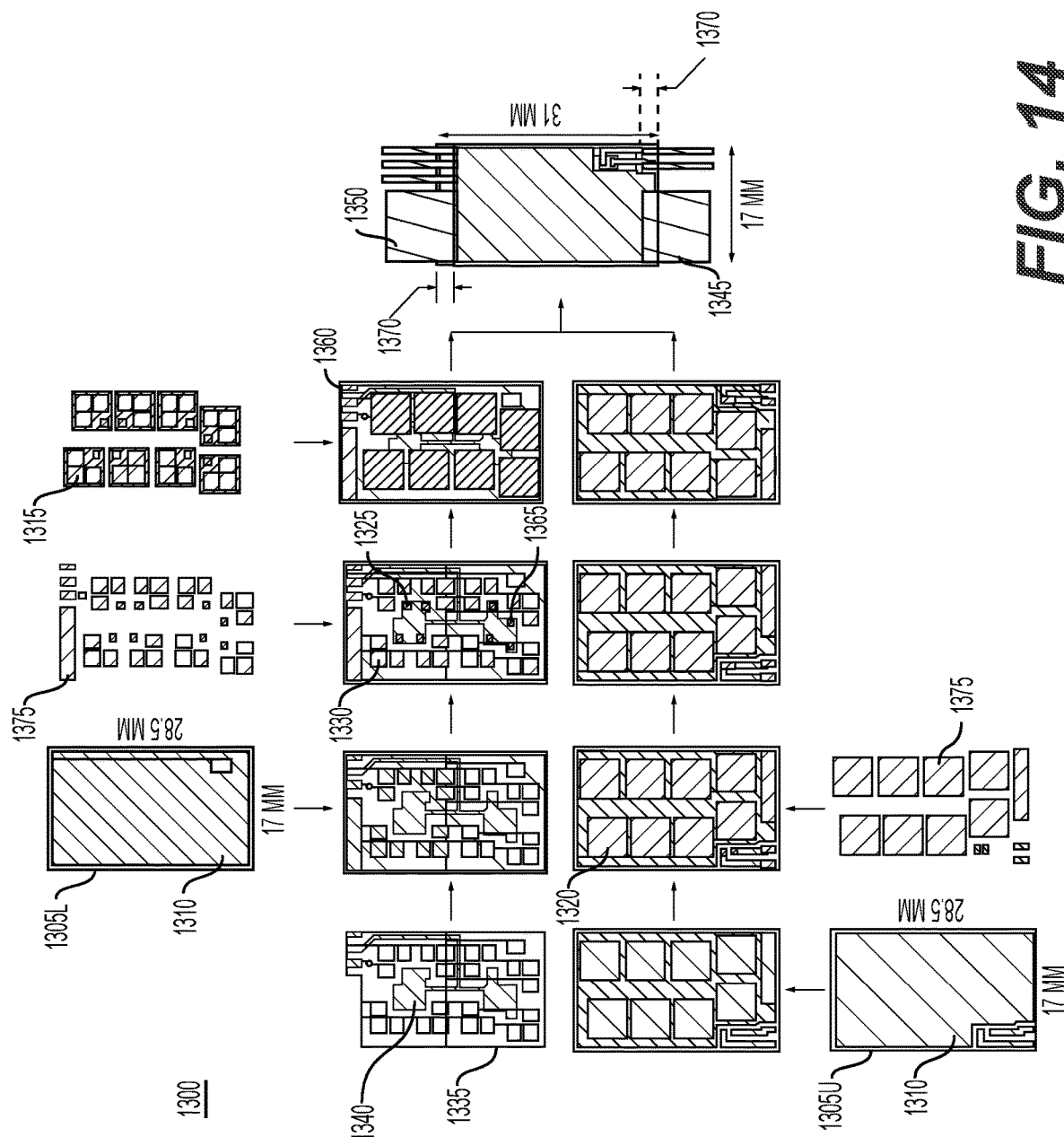
FIG. 14 depicts an assembly of an exemplary power module including a shifted substrate, according to one or more embodiments.

FIG. 14 depicts an assembly of an exemplary power module 1300 including a shifted substrate, according to one or more embodiments. FIG. 14 depicts various layers of a dual-side-cooled power module 1300 according to one or more embodiments, and an assembly of the layers into a complete device. In FIG. 14, the reference numbers refer to the same components as depicted in FIG. 13. Power module 1300 may include solder pre-forms (or in-forms) 1375. As shown in FIG. 14, upper substrate 1305U and lower substrate 1305L may be individually assembled, and then integrated to form power module 1300.

The assembly may include laminating polyimide film onto the source substrate. The polyimide, carrying the second metal, may replace a solder mask on the source substrate. The assembly may include using placed informs rather than a solder print operation, and may provide a consistency in height necessary to reduce a variation in thickness. Placed informs may also allow introduction of a higher temperature solder. The assembly may include an offset substrate requiring different fixturing during overmold. The offset substrate may allow for a thicker lead frame to be used, which may carry higher currents. The power module 1300 may provide a significant increase in current capability relative to some systems.

Figure 15:
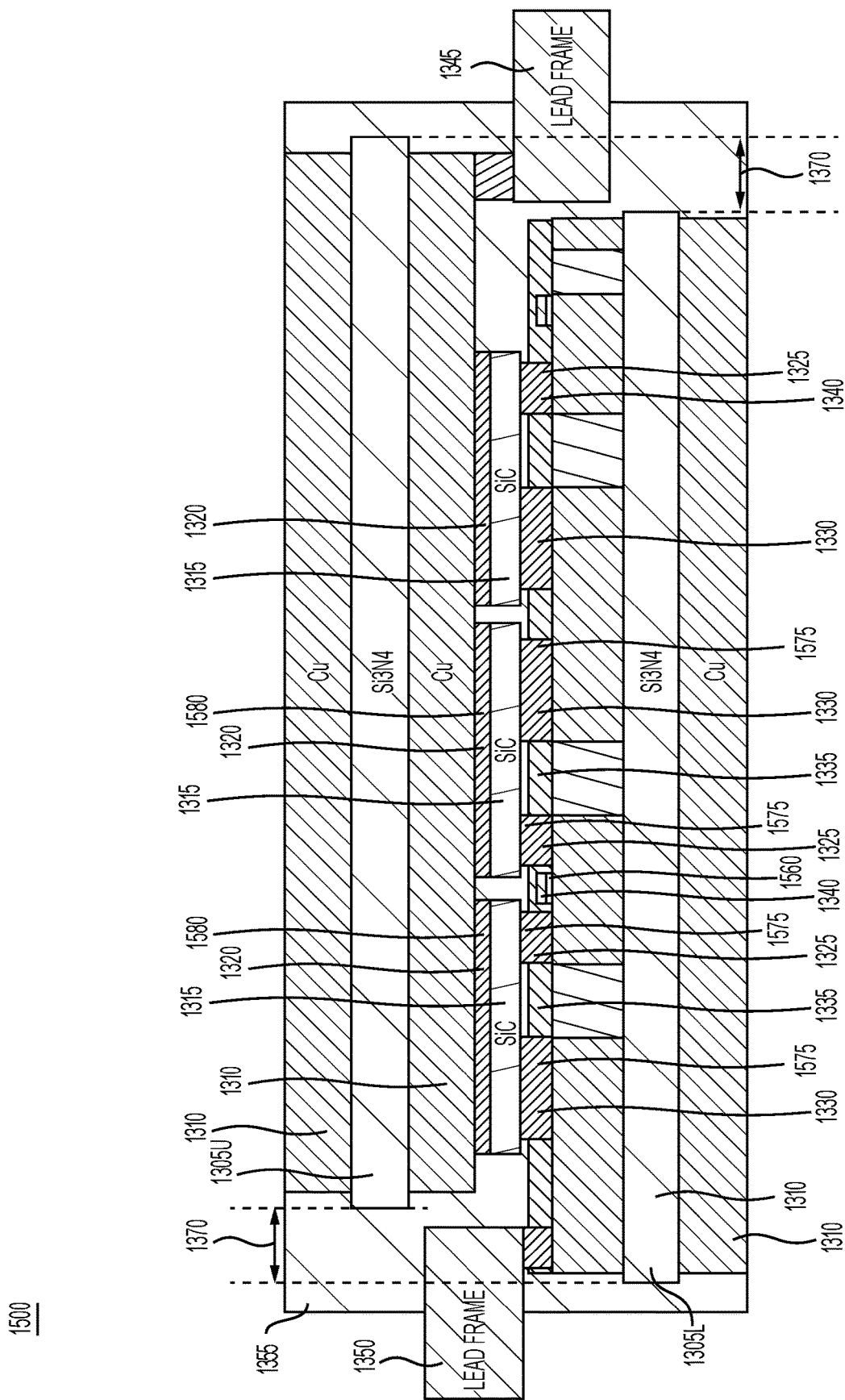
FIG. 15 depicts a cross-section view of an exemplary architecture for a sintered power module including a shifted substrate, according to one or more embodiments.

FIG. 15 depicts a cross-section view of an exemplary architecture for a sintered power module including a shifted substrate, according to one or more embodiments. FIG. 15 depicts a cross-section view of a dual-side-cooled power module 1500 according to one or more embodiments using a sintered assembly.

In contrast to the power module 1300 depicted in FIG. 13, which uses a soldered assembly, the power module 1500 depicted in FIG. 15 shows a sintered assembly and further includes via 1560 to AMB or DBC copper, one or more sinter preforms 1575, and sinter film 1580. Elements common to both power module 1300 and power module 1500 are not re-numbered from FIG. 13.

Figure 16:
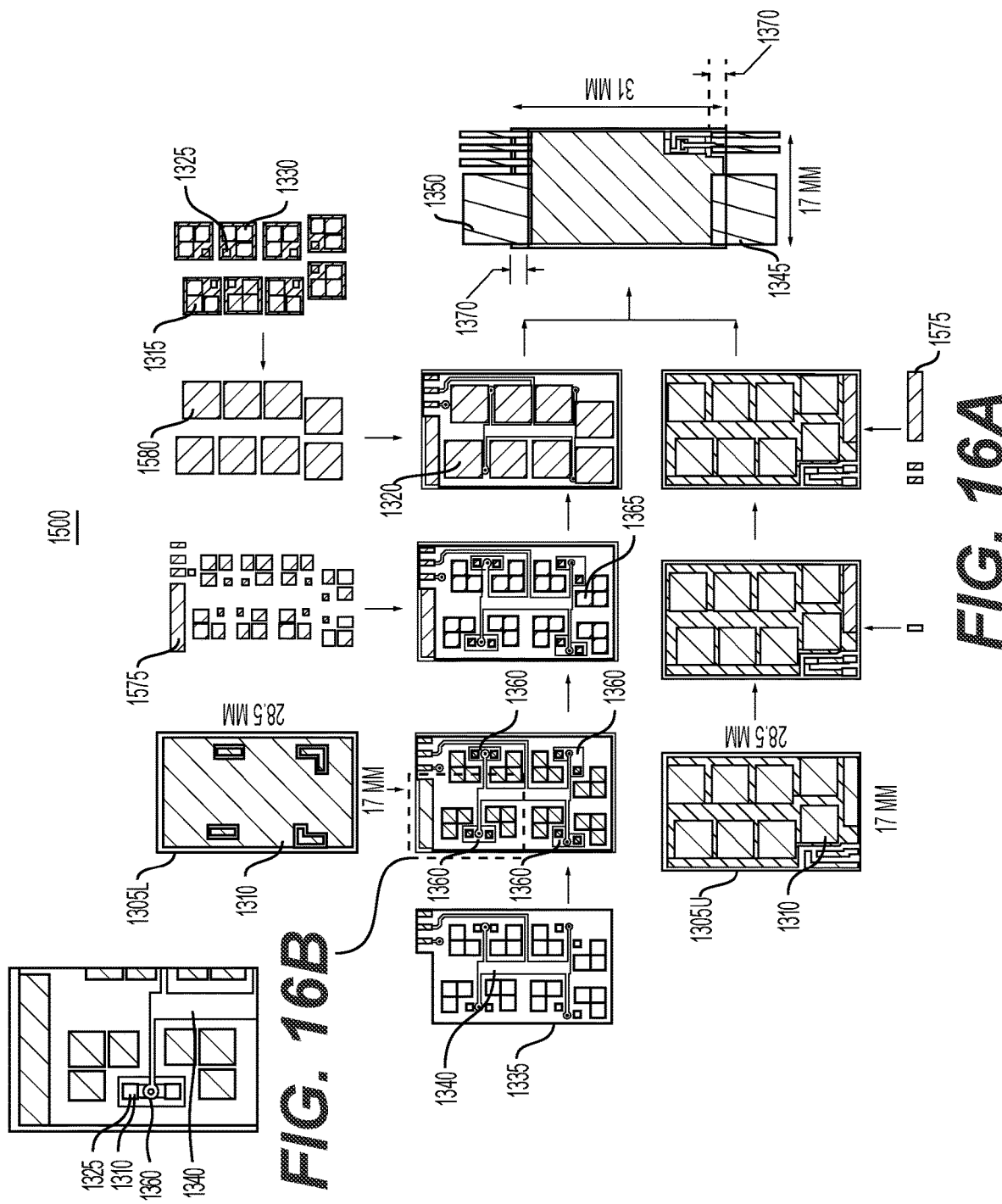
FIGS. 16A and 16B depict an assembly of an exemplary sintered power module including a shifted substrate, according to one or more embodiments.

FIGS. 16A and 16B depict an assembly of an exemplary sintered power module including a shifted substrate, according to one or more embodiments. FIG. 16A and FIG. 16B depict various layers of a dual-side-cooled power module 1500 using a sintered assembly according to one or more embodiments, and an assembly of the layers into a complete device. As shown in FIG. 14, upper substrate 1305U and lower substrate 1305L may be individually assembled, and then integrated to form power module 1500.

A sintered power module 1500 may have increased reliability of the interconnect, which may allow the die to maintain higher temperatures for longer periods without inducing creep failure modes. FIG. 16A and FIG. 16B depict sintering for both the gate and the source, compared to some systems which may use a wire-bonded gate. FIG. 16B depicts an opening in the polyimide for both the gate and the source. The gate may be on an island opened on the first metal (substrate). The second metal gate runner carried by the polyimide may make a connection to the island through a via between the first and second metal. The via may provide a substrate height at the interface that is the same between the gate and the source, which may avoid compliancy at the gate pad relative to polyimide being under the gate.

Figure 17:
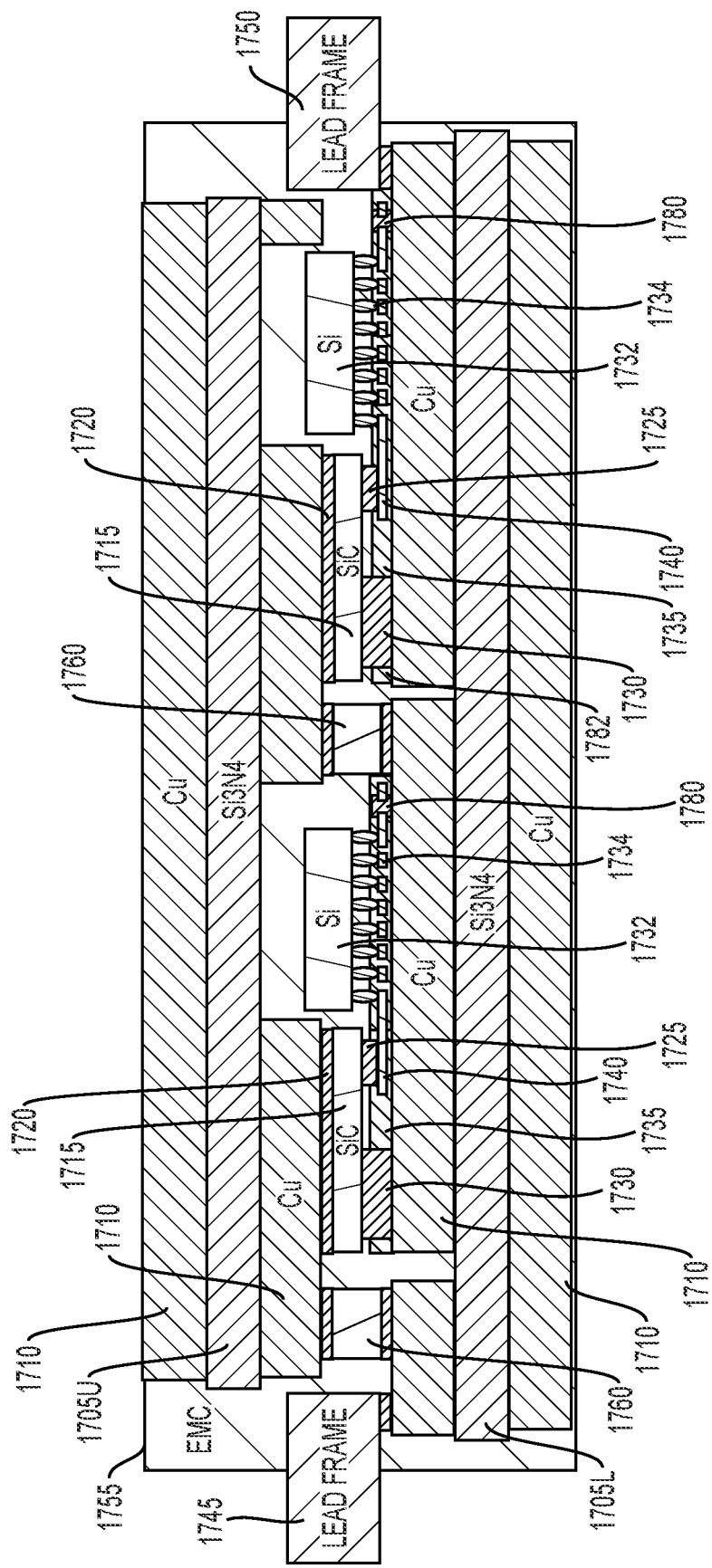
FIG. 17 depicts a cross-section view of an exemplary architecture for a power module including a point-of-use switch controller, according to one or more embodiments.

FIG. 17 depicts a cross-section view of an exemplary architecture for a power module including a point-of-use switch controller, according to one or more embodiments. One or more embodiments may include a power module (e.g. upper phase power module 140 and/or lower phase power module 145) to accommodate an on-board gate driver (e.g. point-of-use upper phase B controller 142B), which may also be referred to as a point-of-use switch controller, a point-of-use controller, an internal IC, or an integrated gate driver. A point-of-use controller may improve control of a gate of power device switches (e.g. upper phase B switches 144B) of the power module. Improved gate control may reduce switching time, while controlling overshoots with dynamic control of the gate current during the turn-on and turn-off events. A gate driver may include multiple individually controlled gate drivers (e.g. north switches control and diagnostics controller 450N and south switches control and diagnostics controller 450S).

Improved gate control may rely on being able to dynamically control the current to the gate during turn-on and turn-off operations of the power switch, and may require a low gate loop inductance. One or more embodiments may increase the upper temperature boundary condition for the power module. For example, one or more embodiments may use SiC MOSFETs with a higher junction temperature to increase the upper temperature limit. A thermal stack may be configured so the materials do not exceed the specified capability. One or more embodiments may include an internal ASIC (point-of-use controller) for temperature sense without a custom SiC FET or thermistors. Thus, one or more embodiments may support temperature sensing of upper and lower portions of a half-H switch. One or more embodiments may use only a point-of-use controller to accurately sense temperature. One or more embodiments may additionally or alternatively use thermistors or SiC/IGBT devices with temperature sensing functions.

One or more embodiments may provide a power module that may experience reduced switching losses. One or more embodiments may support multiple pins for gate control.

FIG. 17 shows a power module 1700 including two stacked substrates including upper substrate 1705U and lower substrate 1705L, both of ceramic, e.g., silicon nitride (Si$_3$N$_4$) having thick metallization, e.g., direct bond copper (DBC) or active metal brazing (AMB) 1710 may be employed. The power module 1700 may include a semiconductor (e.g., silicon carbide (SiC)) die 1715 that has a drain connection 1720 to the upper substrate 1705U. The source connection 1730 may be attached to the lower substrate 1705L. A polyimide or flex circuit 1735 including a base polyimide material with an internal copper layer 1740 may be used, thus making interconnect possible to the gate connection 1725 of the SiC MOSFET and, for example, a surface mount component such as integrated gate driver 1732. The surface mount component for power module 1700 is not limited to integrated gate driver 1732, and other components such as temperature sensors, capacitors, or resistors could be surface mount components.

Power module 1700 may be an implementation of upper phase power module 140 and/or lower phase power module 145, for example. Integrated gate driver 1732 may be an implementation of point-of-use upper phase A controller 142A, for example. The SiC MOSFET including SiC die 1715 and gate connection 1725 may be an implementation of upper phase A switches 144A, for example.

The integrated gate driver 1732 may also mounted to the internal copper layer 1740 carried by the polyimide circuit 1735 with solder bumps 1734. Other items in power module 1700 may include electrically conductive spacers 1760 that provide a high current interconnect between the upper substrate 1705U and lower substrate 1705L, the lead frame 1745 connection for the drain of the upper switch (left side SiC die 1715), and lead frame 1750 connection for the source of the lower switch (right side SiC die 1715). The assembly may include overmold with a dielectric material 1755. The polyimide or flex circuit 1735 may provide via connections 1780 to the source plane and solder stop 1782 for various components. The upper substrate 1705U and lower substrate 1705L may be offset from each other to enable the use of thicker lead frames to enable conduction of higher currents than typically supported with thin power module designs. The power leads 1745 and 1750 may be sintered, soldered, or ultrasonically welded to power module 1700.

Via connections 1780 may be used for current sense. The power module 1700 may incorporate voids in the polyimide or flex circuit 1735 to enhance the epoxy fill beneath the polyimide layer. The power module 1700 may incorporate a second metal layer in polyimide or flex circuit 1735 to allow circuit interconnects without consuming DBC substrate area in order to maintain a minimum form factor.

Power connections and signal connections are shown to utilize a copper leadframe, but other interconnect methods such as flex circuits are contemplated. One or more embodiments may include a power module 1700 including an on-substrate snubber network and decoupling capacitor.

Figure 18:
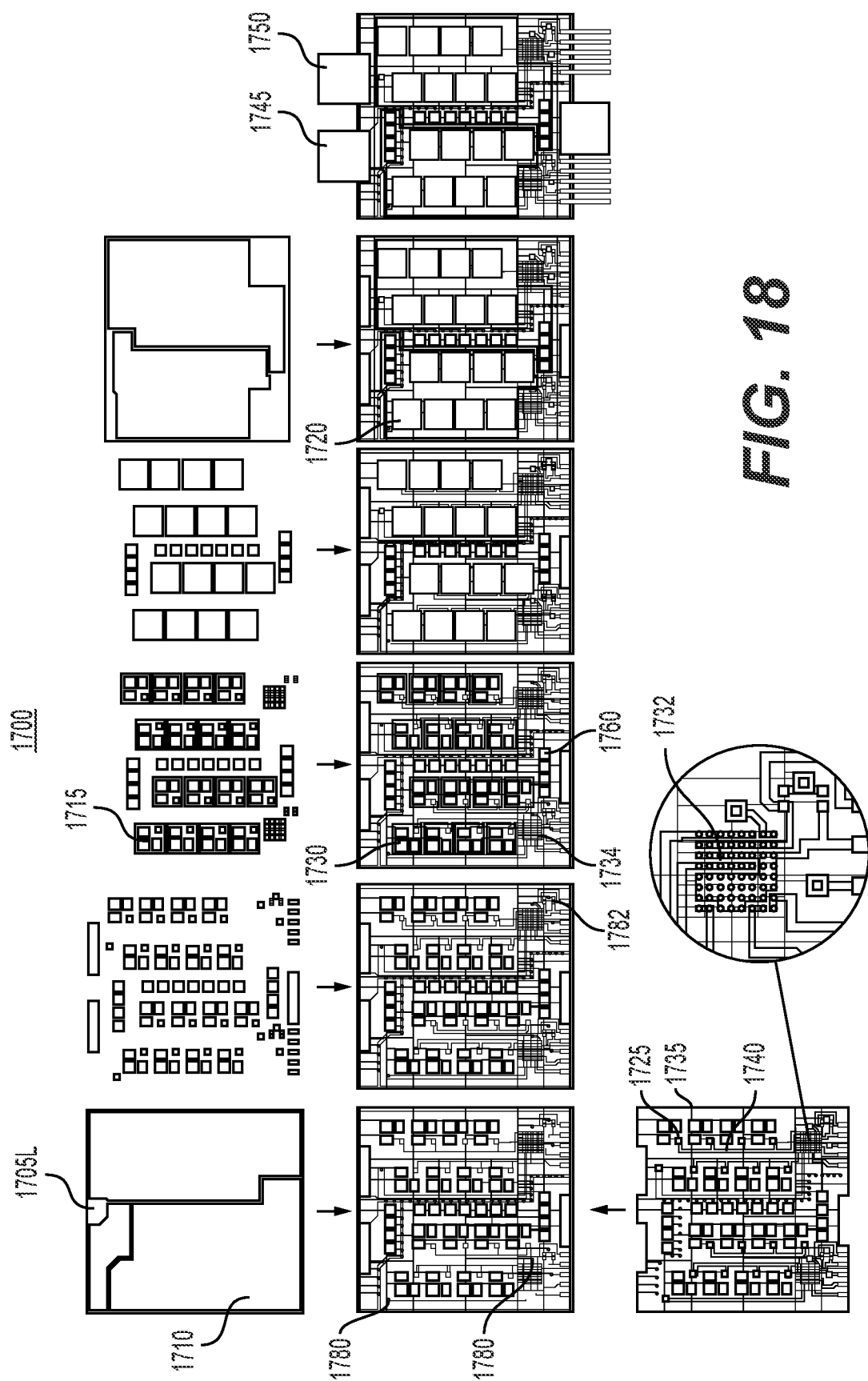
FIG. 18 depicts an assembly of an exemplary power module including a point-of-use switch controller, according to one or more embodiments.

FIG. 18 depicts an assembly of an exemplary power module including a point-of-use switch controller, according to one or more embodiments. FIG. 18 shows a planar view of a possible design using the same numbering scheme as FIG. 17. As shown in FIG. 18, power module 1700 may be assembled by adding layers to a lower substrate 1705L. The second metal layer within the polyimide may provide signal routing as fine lines and spaces that are not possible on the substrate due to the metal thickness. The solder openings may be about 250 μm in diameter. FIG. 18 depicts an array of round openings in the coverlet that provide a solder-stop for the second layer signals.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A power module, comprising:
a first substrate having an outer surface and an inner surface, the first substrate extending from a first longitudinal end toward a second longitudinal end;

a semiconductor die coupled to the inner surface of the first substrate; and a second substrate having an outer surface and an inner surface, the semiconductor die being coupled to the inner surface of the second substrate, the second substrate extending from a first longitudinal end toward a second longitudinal end, wherein the first longitudinal end of the first substrate is longitudinally offset from the first longitudinal end of the second substrate in a first direction, and wherein the second longitudinal end of the first substrate is offset from the second longitudinal end of the second substrate in the first direction.

2. The power module of claim 1, wherein the offset provides a first region on the inner surface of the first substrate and a second region on the inner surface of the second substrate for lead frame connections while maintaining a pre-offset distance between the inner surface of the first substrate and the inner surface of the second substrate.

3. The power module of claim 1, wherein a length of the first substrate is approximately equal to a length of the second substrate.

4. The power module of claim 1, wherein a length of the first substrate is greater than a length of the second substrate.

5. The power module of claim 1, further including a first lead frame coupled to the inner surface of the first substrate.

6. The power module of claim 5, further including a second lead frame coupled to the inner surface of the first substrate.

7. The power module of claim 5, further including a second lead frame coupled to the inner surface of the second substrate.

8. The power module of claim 5, wherein the first lead frame has a thickness greater than 500 microns.

9. The power module of claim 5, wherein the first lead frame has a thickness greater than 700 microns.

10. The power module of claim 5, wherein the first lead frame has a thickness greater than a space between the inner surface of the first substrate and the inner surface of the second substrate.

11. The power module of claim 1, further including an overmold coupled to the first substrate, the second substrate, and the semiconductor die.

12. An inverter comprising the power module of claim 1.

13. A vehicle comprising the inverter of claim 12.

* * * * *